United States Patent
Hirayama et al.

(10) Patent No.: US 10,068,778 B2
(45) Date of Patent: Sep. 4, 2018

(54) PLASMA PROCESSING METHOD AND PLASMA PROCESSING APPARATUS

(71) Applicant: TOKYO ELECTRON LIMITED, Tokyo (JP)

(72) Inventors: Yusuke Hirayama, Miyagi (JP); Masaaki Miyagawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/308,212

(22) PCT Filed: May 20, 2015

(86) PCT No.: PCT/JP2015/064495
§ 371 (c)(1),
(2) Date: Nov. 1, 2016

(87) PCT Pub. No.: WO2015/186525
PCT Pub. Date: Dec. 10, 2015

(65) Prior Publication Data
US 2017/0076956 A1    Mar. 16, 2017

(30) Foreign Application Priority Data

Jun. 2, 2014   (JP) ................................. 2014-114336
Oct. 7, 2014   (JP) ................................. 2014-206666

(51) Int. Cl.
*H01L 21/31*      (2006.01)
*H01L 21/311*     (2006.01)
(Continued)

(52) U.S. Cl.
CPC .... *H01L 21/31116* (2013.01); *C23C 16/4404* (2013.01); *C23C 16/4405* (2013.01);
(Continued)

(58) Field of Classification Search
None
See application file for complete search history.

(56) References Cited

U.S. PATENT DOCUMENTS 5,716,494 A * 2/1998 Imai ................. H01L 21/30604
                                                    257/E21.219
5,846,373 A * 12/1998 Pirkle ................. C23C 16/4405
                                                    156/345.25
(Continued)

FOREIGN PATENT DOCUMENTS

JP    4-345030 A    12/1992
JP    10-144667 A   5/1998
(Continued)

OTHER PUBLICATIONS

International Search Report dated Jul. 21, 2015 in PCT/JP2015/064495 (4 pages).

*Primary Examiner* — Evren Seven
(74) *Attorney, Agent, or Firm* — Rothwell, Figg, Ernst & Manbeck, P.C.

(57) ABSTRACT

This plasma processing method includes a film formation step, a plasma processing step and a removal step. In the film formation step, a silicon oxide film is formed on the surface of a member within a chamber by means of plasma of an oxygen-containing gas and a silicon-containing gas at a flow rate ratio of the oxygen-containing gas to the silicon-containing gas of 0.2-1.4. In the plasma processing step, after the formation of the silicon oxide film on the surface of the member, an object to be processed that has been carried into the chamber is subjected to plasma processing with use of plasma of a processing gas. In the removal step, after carrying the plasma-processed object out of the chamber, the silicon oxide film is removed from the surface of the member by means of plasma of a fluorine-containing gas.

16 Claims, 16 Drawing Sheets

(51) Int. Cl.
  *C23C 16/44* (2006.01)
  *H01L 21/205* (2006.01)
  *H01L 21/3065* (2006.01)
  *H05H 1/46* (2006.01)
  *H01J 37/32* (2006.01)
  *H01L 21/02* (2006.01)
  *H01L 21/67* (2006.01)

(52) U.S. Cl.
  CPC .... *H01J 37/32009* (2013.01); *H01J 37/3244* (2013.01); *H01J 37/3266* (2013.01); *H01J 37/32165* (2013.01); *H01J 37/32449* (2013.01); *H01J 37/32477* (2013.01); *H01L 21/02115* (2013.01); *H01L 21/02123* (2013.01); *H01L 21/02164* (2013.01); *H01L 21/02208* (2013.01); *H01L 21/02274* (2013.01); *H01L 21/205* (2013.01); *H01L 21/3065* (2013.01); *H01L 21/67069* (2013.01); *H05H 1/46* (2013.01); *H01J 2237/334* (2013.01)

(56) References Cited

U.S. PATENT DOCUMENTS

| | | | |
|---|---|---|---|
| 6,071,573 A | 6/2000 | Koemtzopoulos et al. | |
| 6,443,165 B1* | 9/2002 | Akahori | C23C 16/4405 134/1.1 |
| 6,451,686 B1* | 9/2002 | Ngai | C23C 16/402 257/E21.276 |
| 6,790,374 B1* | 9/2004 | Ho | H01J 37/32495 134/1.1 |
| 7,204,913 B1* | 4/2007 | Singh | C23C 16/4404 118/724 |
| 9,745,658 B2* | 8/2017 | Kang | C23C 16/45525 |
| 2005/0221020 A1* | 10/2005 | Fukiage | C23C 16/4404 427/569 |
| 2007/0087579 A1* | 4/2007 | Kitayama | C23C 16/4405 438/778 |
| 2007/0204797 A1* | 9/2007 | Fischer | C23C 16/4404 118/723 R |
| 2008/0029021 A1* | 2/2008 | Kim | C23C 16/345 117/97 |
| 2008/0118663 A1* | 5/2008 | Choi | C23C 16/4404 427/579 |
| 2008/0138995 A1* | 6/2008 | Omura | H01J 37/32091 438/714 |
| 2009/0215251 A1* | 8/2009 | Vellaikal | H01J 37/32412 438/513 |
| 2010/0098884 A1* | 4/2010 | Balseanu | C23C 16/0272 427/577 |
| 2010/0298738 A1* | 11/2010 | Felts | B05D 1/62 600/576 |
| 2010/0330773 A1* | 12/2010 | Hiyama | C23C 16/045 438/400 |
| 2011/0159669 A1* | 6/2011 | Yang | C23C 16/0227 438/482 |
| 2011/0226734 A1* | 9/2011 | Sumiya | H01J 37/32192 216/41 |
| 2011/0252899 A1* | 10/2011 | Felts | C23C 16/045 73/865.8 |
| 2013/0177706 A1* | 7/2013 | Baluja | B05D 3/066 427/226 |
| 2013/0213434 A1* | 8/2013 | Wang | C23C 16/4404 134/1.2 |
| 2014/0053866 A1* | 2/2014 | Baluja | C11D 11/0041 134/1.1 |
| 2014/0272184 A1* | 9/2014 | Sreekala | C23C 16/4404 427/534 |
| 2015/0107618 A1* | 4/2015 | Sun | C23C 16/4405 134/1.2 |
| 2015/0228463 A1* | 8/2015 | Manna | H01J 37/32862 427/249.1 |
| 2015/0294880 A1* | 10/2015 | Anderson | H01L 21/31116 438/719 |
| 2016/0214062 A1* | 7/2016 | Roh | B01D 63/06 |

FOREIGN PATENT DOCUMENTS

| | | |
|---|---|---|
| JP | 11-224858 A | 8/1999 |
| JP | 2003-17479 A | 1/2003 |
| JP | 2011-146596 A | 7/2011 |
| JP | 2013-4777 A | 1/2013 |

* cited by examiner

FIG. 17

| | | UEL C (90) | UEL E (91) | UEL Ex (92) | D/S (93) | Buffle (94) |
|---|---|---|---|---|---|---|
| NON-MODIFICATION (SiF4/O2/Ar= 300/300/100) | DEPOSITION AMOUNT[nm] | 210 | 192 | 171 | 96 | 108 |
| | ETCHING AMOUNT[nm] | 45.0 | 68.0 | 62.0 | 62.0 | 47.0 |
| MODIFICATION (H2/Ar) | DEPOSITION AMOUNT[nm] | 217 | 177 | 166 | 86 | 106 |
| | ETCHING AMOUNT[nm] | 28.0 | 29.0 | 25.0 | 15.2 | 11.0 |

(a)            (b)

(a)            (b)

PLASMA PROCESSING METHOD AND PLASMA PROCESSING APPARATUS

CROSS REFERENCE TO RELATED APPLICATION

This application is a 35 U.S.C. 371 National Phase Entry Application from PCT/JP2015/064495, filed May 20, 2015, which claims priority to Japanese Patent Application Nos. 2014-114336, filed Jun. 2, 2014 and 2014-206666, filed Oct. 7, 2014, the disclosures of which are incorporated herein in their entirety by reference.

TECHNICAL FIELD

Various aspects and exemplary embodiments of the present disclosure relate to a plasma processing method and a plasma processing apparatus.

BACKGROUND

In a semiconductor manufacturing process, a plasma processing apparatus that performs a plasma processing for the purpose of, for example, deposition or etching of a thin film has been widely used. The plasma processing apparatus may be, for example, a plasma chemical vapor deposition (CVD) apparatus that performs a deposition processing of a thin film, or a plasma etching apparatus that performs an etching processing.

Meanwhile, in the plasma processing apparatus, a member (hereinafter, properly referred to as an "in-chamber member") arranged within a chamber is exposed to the plasma of a processing gas during various plasma processings, and thus is required to have a plasma resistance. In this respect, for example, Patent Document 1 discloses that, before a workpiece is subjected to a plasma processing, a silicon-containing gas that contains oxygen is supplied at an oxygen-to-$SiF_4$ gas flow rate ratio of 1.7 or more to form a fluorine-containing silicon oxide film as a protective film on a surface of an in-chamber member, thereby increasing the plasma resistance of the in-chamber member.

PRIOR ART DOCUMENT

Patent Document

Patent Document 1: U.S. Pat. No. 6,071,573

DISCLOSURE OF THE INVENTION

Problems to be Solved

However, in the conventional technology where an oxygen-to-$SiF_4$ gas flow rate ratio of 1.7 or more, an amount of a silicon oxide film etched by the plasma of a processing gas is increased.

That is, in the conventional technology, a silicon-containing gas that contains oxygen is supplied at an oxygen-to-$SiF_4$ gas flow rate ratio of 1.7 or more. Then, oxygen radicals and Si radicals in plasma of the silicon-containing gas that contains oxygen are caused to react in a space within a chamber to produce a silicon oxide. The produced silicon oxide is deposited as a silicon oxide film on an in-chamber member. In some cases, the silicon oxide film deposited on the in-chamber member may be etched to a thickness equal to or larger than the thickness of the silicon oxide film by the plasma of the processing gas. Therefore, in the conventional technology, the surface of the in-chamber member is deteriorated and worn, and thus, the protection of the in-chamber member is insufficient.

Means to Solve the Problems

A plasma processing method according to an aspect of the present disclosure includes a film forming step, a plasma processing step, and a removal step. In the film forming step, a silicon oxide film is formed on the surface of a member within a chamber by the plasma of an oxygen-containing gas and a silicon-containing gas at a flow rate ratio of the oxygen-containing gas to the silicon-containing gas of 0.2 to 1.4. In the plasma processing step, after the formation of the silicon oxide film on the surface of the member, a workpiece carried into the chamber is subjected to a plasma processing by the plasma of a processing gas. In the removal step, after carrying the plasma-processed workpiece out of the chamber, the silicon oxide film is removed from the surface of the member by the plasma of a fluorine-containing gas.

Effects of the Invention

According to various aspects and exemplary embodiments of the present disclosure, a plasma processing method and a plasma processing apparatus are realized in which a member within a chamber is protected from plasma, and is suppressed from being deteriorated and worn.

BRIEF DESCRIPTION OF THE DRAWINGS

FIG. 17 is a view illustrating an example of a deposition amount and an etching amount according to whether a silicon oxide film is modified or non-modified.

DETAILED DESCRIPTION TO EXECUTE THE INVENTION

Figure 1:
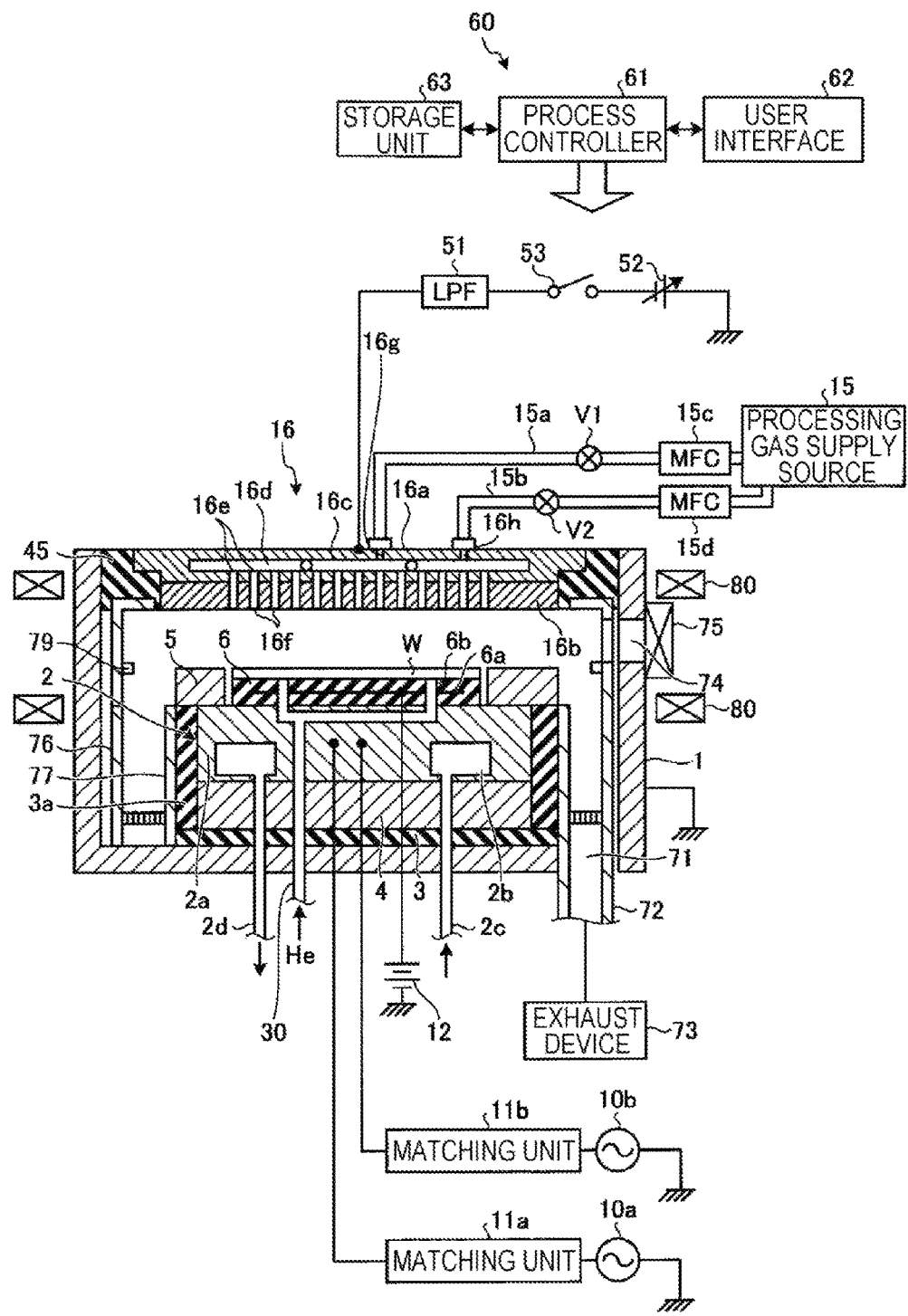
FIG. 1 is a schematic sectional view illustrating a plasma processing apparatus applied to a plasma processing method according to the present exemplary embodiment.

Hereinafter, various exemplary embodiments will be described in detail with reference to the drawings. Meanwhile, in the respective drawings, the same or corresponding parts will be denoted by the same reference numerals.

In one embodiment, a plasma processing method according to the present exemplary embodiment includes: a film forming step of forming a silicon oxide film on a surface of a member within a chamber by the plasma of an oxygen-containing gas and a silicon-containing gas in which a flow rate ratio of the oxygen-containing gas to the silicon-containing gas ranges from 0.2 to 1.4; a plasma processing step of performing a plasma processing a workpiece carried into the chamber by the plasma of a processing gas after the silicon oxide film is formed on the surface of the member; and a removal step of removing the silicon oxide film from the surface of the member by the plasma of a fluorine-containing gas after the workpiece that has been subjected to the plasma processing is carried out of the chamber.

Also, in one embodiment, in the plasma processing method according to the present exemplary embodiment, in the film forming step, a flow rate of the silicon-containing gas is 150 sccm or more.

Also, in one embodiment, in the plasma processing method according to the present exemplary embodiment, the silicon-containing gas contains at least one of $SiF_4$ and $SiCl_4$.

Also, in one embodiment, the plasma processing method according to the present exemplary embodiment further includes a modification step of modifying the silicon oxide film by the plasma of a reducing gas containing at least one of $H_2$, $CH_4$ and $C_3H_6$ after the film forming step.

Also, in one embodiment, the plasma processing method according to the present exemplary embodiment further includes a film pre-forming step of forming a carbon-containing film on the surface of the member by the plasma of a carbon-containing gas before the film forming step.

Also, in one embodiment, in the plasma processing method according to the present exemplary embodiment, the carbon-containing gas contains a gas represented by $C_xH_yF_z$ (in a formula, x, y and z represent integers, and $(z-y)/x$ is 2 or less).

Also, in one embodiment, in the plasma processing method according to the present exemplary embodiment, the carbon-containing gas contains at least one of $CH_4$, $C_4F_8$, $CHF_3$, $CH_3F$, and $C_2H_4$.

Also, in one embodiment, in the plasma processing method according to the present exemplary embodiment, the removal step includes a first removal step of removing the silicon oxide film from the surface of the member by the plasma of the fluorine-containing gas, and a second removal step of removing the carbon-containing film from the surface of the member by the plasma of an oxygen-containing gas.

Also, in an embodiment, a plasma processing method according to the present exemplary embodiment includes: a film forming step of forming a carbon-silicon-containing film on a surface of a member within a chamber by the plasma of a carbon-containing gas, an oxygen-containing gas and a silicon-containing gas in which a flow rate ratio of the oxygen-containing gas to the silicon-containing gas ranges from 0.2 to 1.4; a plasma processing step of performing a plasma processing a workpiece carried into the chamber by the plasma of a processing gas after the carbon-silicon-containing film is formed on the surface of the member; and a removal step of removing the carbon-silicon-containing film from the surface of the member by the plasma of an oxygen-fluorine-containing gas after the workpiece that has been subjected to the plasma processing is carried out of the chamber.

Also, in an embodiment, in the plasma processing method according to the present exemplary embodiment, the carbon-containing gas contains a gas represented by $C_xH_yF_z$ (in a formula, x, y and z represent integers, and $(z-y)/x$ is 2 or less), and the silicon-containing gas contains at least one of $SiF_4$ and $SiCl_4$.

Also, in an embodiment, in the plasma processing method according to the present exemplary embodiment, the carbon-containing gas contains at least one of $CH_4$, $C_4F_8$, $CHF_3$, $CH_3F$ and $C_2H_4$.

Also, in an embodiment, the plasma processing method according to the present exemplary embodiment further includes a modification step of modifying the carbon-silicon-containing film by the plasma of a reducing gas containing at least one of $H_2$, $CH_4$ and $C_3H_6$ after the film forming step.

In an embodiment, a plasma processing apparatus according to the present exemplary embodiment includes: a chamber where a plasma processing is performed on a workpiece; an exhaust unit configured to decompress an inside of the chamber; a gas supply unit configured to supply a processing gas into the chamber; and a controller that executes: a film forming step of forming a silicon oxide film on a surface of a member within the chamber by the plasma of an oxygen-containing gas and a silicon-containing gas in which a flow rate ratio of the oxygen-containing gas to the silicon-containing gas ranges from 0.2 to 1.4; a plasma processing step of performing a plasma processing the workpiece carried into the chamber by the plasma of the processing gas after the silicon oxide film is formed on the surface of the member; and a removal step of removing the silicon oxide film from the surface of the member by the plasma of a fluorine-containing gas after the workpiece that has been subjected to the plasma processing is carried out of the chamber.

FIG. 1 is a schematic sectional view illustrating a plasma processing apparatus applied to a plasma processing method according to the present exemplary embodiment. The plasma processing apparatus illustrated in FIG. 1 includes a processing chamber 1 which is hermetically configured and electrically connected to a ground potential. The processing chamber 1 is formed in a cylindrical shape by, for example, an aluminum material with a surface on which an anodized film is formed. Within the processing chamber 1, a placing table 2 is provided to horizontally support a semiconductor wafer W which is a workpiece.

The placing table 2 has a substrate 2a made of a conductive metal such as, for example, aluminum, and functions as a lower electrode. The placing table 2 is supported on a conductive support table 4 through an insulating plate 3. Also, a focus ring 5 made of, for example, a single-crystal silicon, is provided at the outer periphery above the placing table 2. Also, a cylindrical inner wall member 3a made of, for example, quartz, is provided to surround the periphery of the placing table 2 and the support table 4.

A shower head 16 functioning as an upper electrode is provided above the placing table 2 to face the placing table 2 in parallel, that is, to face a semiconductor wafer W supported by the placing table 2 in parallel. The shower head 16 and the placing table 2 are configured to function as a pair of electrodes (an upper electrode and a lower electrode). A first high-frequency power source 10a is connected to the substrate 2a of the placing table 2 through a first matching unit 11a. Also, a second high-frequency power source 10b is connected to the substrate 2a of the placing table 2 through a second matching unit 11b. The first high-frequency power source 10a is intended for generating plasma, so that a high frequency power at a predetermined frequency (e.g., 100 MHz) is supplied from the first high-frequency power source 10a to the substrate 2a of the placing table 2. Also, the second high-frequency power source 10b is intended for ion attraction (bias), so that a high frequency power at a predetermined frequency (e.g., 13 MHz) lower than that of the first high-frequency power source 10a is supplied from the second high-frequency power source 10b to the substrate 2a of the placing table 2.

An electrostatic chuck 6 is provided on the top surface of the placing table 2 to electrostatically attract the semiconductor wafer W. The electrostatic chuck 6 has a configuration in which an electrode 6a is interposed between insulators 6b, and a DC power source 12 is connected to the electrode 6a. Then, when a DC voltage is applied to the electrode 6a from the DC power source 12, the semiconductor wafer W is attracted by a Coulomb force.

A coolant flow path 2b is formed within the placing table 2, and a coolant inlet pipe 2c and a coolant outlet pipe 2d are connected to the coolant flow path 2b. Then, a coolant such as, for example, Galden is circulated through the coolant flow path 2b, which is capable of controlling the support table 4 and the placing table 2 to a predetermined temperature. Also, a backside gas supply pipe 30 is provided through, for example, the placing table 2 to supply a cold heat transfer gas (a backside gas) such as, for example, a helium gas to a rear surface side of the semiconductor wafer W. The backside gas supply pipe 30 is connected to a backside gas supply source (not illustrated). This configuration allows the semiconductor wafer W attracted and held by the electrostatic chuck 6 on the top surface of the placing table 2 to be controlled to a predetermined temperature.

The shower head 16 is provided at a ceiling wall portion of the processing chamber 1. The shower head 16 includes a body portion 16a and an upper top plate 16b forming an electrode plate, and is supported at the upper portion of the processing chamber 1 through an insulating member 45. The body portion 16a is made of a conductive material, e.g., an aluminum material having an anodized surface, and is configured to detachably support the upper top plate 16b at the lower portion thereof. The upper top plate 16b is made of a silicon-containing material, e.g., quartz.

Gas diffusion chambers 16c and 16d are provided within the body portion 16a, and a plurality of gas flow holes 16e are formed at the bottom portion of the body portion 16a to be located below the gas diffusion chambers 16c and 16d. The gas diffusion chamber is divided into two chambers, that is, the gas diffusion chamber 16c provided at a central portion and the gas diffusion chamber 16d provided at a peripheral portion so that supply states of a processing gas at the central portion and the peripheral portion may be independently changed.

Also, gas introducing holes 16f are formed in the upper top plate 16b to extend through the upper top plate 16b in the thickness direction and to overlap the gas flow holes 16e. Through this configuration, the processing gas supplied to the gas diffusion chambers 16c and 16d is supplied into the processing chamber 1 through the gas flow holes 16e and the gas introducing holes 16f to be diffused in a shower form. Also, a temperature regulator such as, for example, a heater (not illustrated) or a pipe (not illustrated) for circulating a coolant is provided in, for example, the body portion 16a, and is configured to control the shower head 16 to a desired temperature during a plasma etching processing.

Two gas inlets 16g and 16h are formed at the body portion 16a to introduce the processing gas to the gas diffusion chambers 16c and 16d. Gas supply pipes 15a and 15b are connected to the gas inlets 16g and 16h, and a processing gas supply source 15 is connected to the other ends of the gas supply pipes 15a and 15b to supply a processing gas for etching. The processing gas supply source 15 is an example of a gas supply unit. In the gas supply pipe 15a, a mass flow controller (MFC) 15c and an opening/closing valve V1 are provided in order from the upstream side. Also, in the gas supply pipe 15b, a mass flow controller (MFC) 15d and an opening/closing valve V2 are provided in order from the upstream side.

Then, the processing gas for plasma etching is supplied from the processing gas supply source 15 to the gas diffusion chambers 16c and 16d through the gas supply pipes 15a and 15b, and then is supplied into the processing chamber 1 from the gas diffusion chambers 16c and 16d through the gas flow holes 16e and the gas introducing holes 16f to be diffused in a shower form. For example, an oxygen-containing gas and a silicon-containing gas used for forming a silicon oxide film on a surface of a member arranged within the processing chamber 1 are supplied from the processing gas supply source 15, as described below. Also, for example, an HBr/NF$_3$-containing processing gas used for a plasma processing on a workpiece is supplied from the processing gas supply source 15. Also, for example, a fluorine-containing gas used for removing the silicon oxide film from the surface of the member arranged within the processing chamber 1 is supplied from the processing gas supply source 15. Details of the gases supplied by the processing gas supply source 15 will be described below.

A variable DC power supply 52 is electrically connected to the shower head 16 as the upper electrode through a low pass filter (LPF) 51. The variable DC power supply 52 is capable of turning on/off power feeding by an on/off switch 53. A current and a voltage of the variable DC power supply 52 and turning on/off of the on/off switch 53 are controlled by a controller 60 to be described below. Also, as described below, when high frequency waves are applied from the first high-frequency power source 10*a* and the second high-frequency power source 10*b* to the placing table 2 and plasma is generated in a processing space, the on/off switch 53 is turned on by the controller 60 as necessary so that a predetermined DC voltage is applied to the shower head 16 as the upper electrode.

An exhaust port 71 is formed at the bottom portion of the processing chamber 1, and an exhaust device 73 is connected to the exhaust port 71 through an exhaust pipe 72. The exhaust device 73 includes a vacuum pump, and is configured to decompress the inside of the processing chamber 1 to a predetermined vacuum degree by operating the vacuum pump. The exhaust device 73 is an example of an exhaust unit. Meanwhile, a carry-in/out port 74 of the semiconductor wafer W is provided at the side wall of the processing chamber 1, and a gate valve 75 is provided at the carry-in/out port 74 to open and close the carry-in/out port 74.

Reference numerals 76 and 77 in the drawing indicate detachable deposition shields. The deposition shield 76 is provided along the inner wall surface of the processing chamber 1, and serves a role of preventing etching by-product (deposition) from being attached to the processing chamber 1. Hereinafter, it is assumed that the inner wall of the processing chamber 1 and the deposition shield 76 may be collectively called "an inner wall of the processing chamber 1." Also, the deposition shield 77 is provided to cover the outer peripheral surface of the placing table 2 serving as the lower electrode, the inner wall member 3*a*, and the support table 4. Hereinafter, it is assumed that the placing table 2, the inner wall member 3*a*, the support table 4 and the deposition shield 77 may be collectively called "a lower electrode." At the position of the deposition shield 76 having substantially the same height as the semiconductor wafer W, a conductive member (GND block) 79 connected to a ground in a DC manner is provided, thereby suppressing an abnormal discharge.

Also, a ring magnet 80 is concentrically disposed around the processing chamber 1. The ring magnet 80 applies a magnetic field to a space between the shower head 16 and the placing table 2. The ring magnet 80 is configured to be rotatable by a rotation mechanism (not illustrated).

The operation of the plasma etching apparatus configured as described above is generally controlled by the controller 60. The controller 60 is provided with a process controller 61 that includes a CPU to control respective units of the plasma etching apparatus, a user interface 62, and a storage unit 63.

The user interface 62 includes, for example, a keyboard by which a process administrator performs an input operation of commands in order to manage the plasma etching apparatus, or a display that visually displays an operation status of the plasma etching apparatus.

The storage unit 63 stores, therein, a control program (software) for realizing various processings executed in the plasma etching apparatus under the control of the process controller 61 or a recipe in which, for example, processing condition data are recorded. Then, as necessary, any recipe is invoked from the storage unit 63 according to, for example, an instruction from the user interface 62, and executed by the process controller 61 so that a desired processing in the plasma etching apparatus is performed under the control of the process controller 61. Also, the control program or the recipe of, for example, the processing condition data may be used in a state of being stored in a computer-readable computer storage medium (e.g., a hard disk, a CD, a flexible disk, or a semiconductor memory), or may be used online by being transmitted at any time from other devices through, for example, a dedicated line.

For example, the controller 60 controls the respective units of the plasma processing apparatus to perform the plasma processing method to be described below. By way of a detailed example, the controller 60 forms a silicon oxide film on the surface of a member by the plasma of an oxygen-containing gas and a silicon-containing gas in which the flow rate ratio of the oxygen-containing gas to the silicon-containing gas ranges from 0.2 to 1.4. Then, after the silicon oxide film is formed, the controller 60 performs a plasma processing on a workpiece carried into the processing chamber 1 using plasma of a processing gas. Then, the controller 60 removes the silicon oxide film from the surface of the member by the plasma of a fluorine-containing gas after the workpiece that has been subjected to the plasma processing is carried out of the processing chamber 1. Here, the member arranged within the processing chamber 1 includes, for example, the inner wall of the processing chamber 1, the placing table 2 as a lower electrode disposed within the processing chamber 1, the inner wall member 3*a*, the support table 4 and the deposition shield 77. Hereinafter, the member arranged within the processing chamber 1 may be called an "in-chamber member." Also, another member includes the shower head 16 as an upper electrode that faces the lower electrode within the processing chamber 1. Also, the workpiece is, for example, the semiconductor wafer W.

Figure 2:
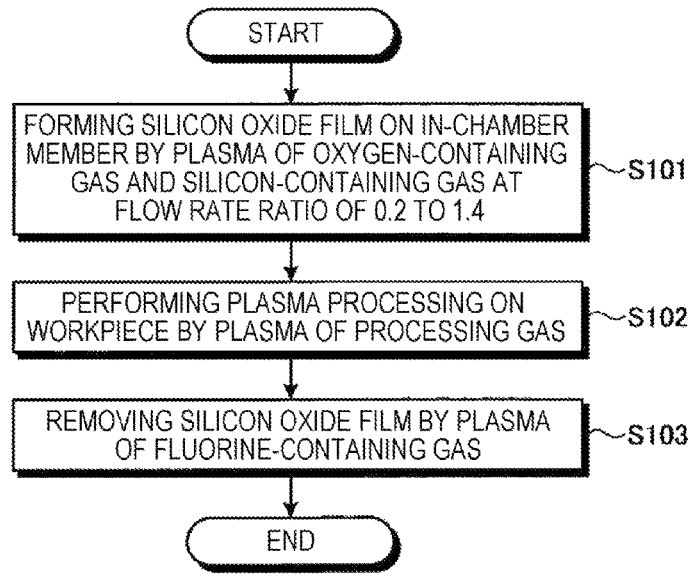
FIG. 2 is a flow chart illustrating an example of a processing flow of the plasma processing method by the plasma processing apparatus according to the present exemplary embodiment.

Hereinafter, descriptions will be made on the plasma processing method by the plasma processing apparatus according to the present exemplary embodiment. FIG. 2 is a flow chart illustrating an example of a processing flow of the plasma processing method by the plasma processing apparatus according to the present exemplary embodiment.

As illustrated in FIG. 2, the plasma processing apparatus performs a film forming step of forming a silicon oxide film on the surface of an in-chamber member by the plasma of an oxygen-containing gas and a silicon-containing gas in which the flow rate ratio of the oxygen-containing gas to the silicon-containing gas ranges from 0.2 to 1.4 (step S101). The in-chamber member includes, for example, the inner wall of the processing chamber 1, the placing table 2 as a lower electrode disposed within the processing chamber 1, the inner wall member 3*a*, and the deposition shield 77. Also, another member includes the shower head 16 as an upper electrode that faces the lower electrode within the processing chamber 1. Also, for example, the flow rate of the silicon-containing gas is 150 sccm or more. The silicon-containing gas contains, for example, at least one of $SiF_4$ and $SiCl_4$. The silicon-containing gas may further contain a rare gas. The rare gas is, for example, Ar or He. The flow rate ratio of the oxygen-containing gas to the silicon-containing gas may range from 0.2 to 1.4, more specifically from 0.2 to 1.0. That is, for example, the flow rate ratio of $O_2/SiF_4$ may range from 0.2 to 1.4, more specifically from 0.2 to 1.0.

The plasma processing apparatus generates a deposition that is the silicon oxide film, on the surface of the in-chamber member by the film forming step. The controller 60 of the plasma processing apparatus generates plasma of the oxygen-containing gas and the silicon-containing gas by supplying the oxygen-containing gas and the silicon-containing gas into the processing chamber 1 from the processing gas supply source 15, and applying a high frequency power for plasma generation into the processing chamber 1 from the first high-frequency power source 10a. Here, the controller 60 does not apply a high frequency power for ion attraction from the second high-frequency power source 10b. As a result, the deposition that is the silicon oxide film is generated on the surface of the in-chamber member.

Figure 3:
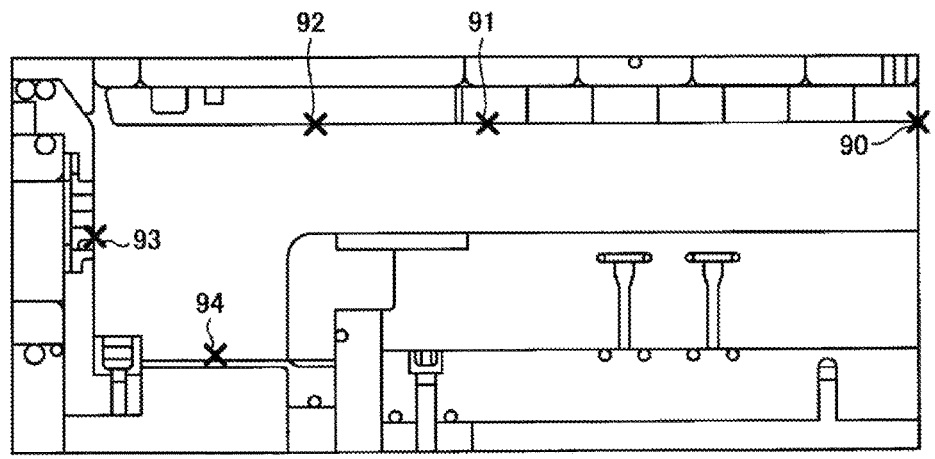
FIG. 3 is a view for explaining exemplary deposition amount measurement points within a chamber in the present exemplary embodiment.

The amount of the silicon oxide film (deposition) generated on the surface of the in-chamber member is varied at respective portions of the processing chamber 1. FIG. 3 is a view for explaining exemplary deposition amount measurement points within a chamber in the present exemplary embodiment. As illustrated in FIG. 3, as for deposition amount measurement points, for example, a measurement point 90 at the center (UEL Cent) of the upper top plate 16b, a measurement point 91 at the edge (UEL Edge) of the upper top plate 16b, a measurement point 92 at the ceiling wall portion (UEL Exhaust) of the processing chamber 1 facing the exhaust port 71, a measurement point 93 at the deposition shield (D/S) 76, and a measurement point 94 at a buffle are set.

Figure 4:
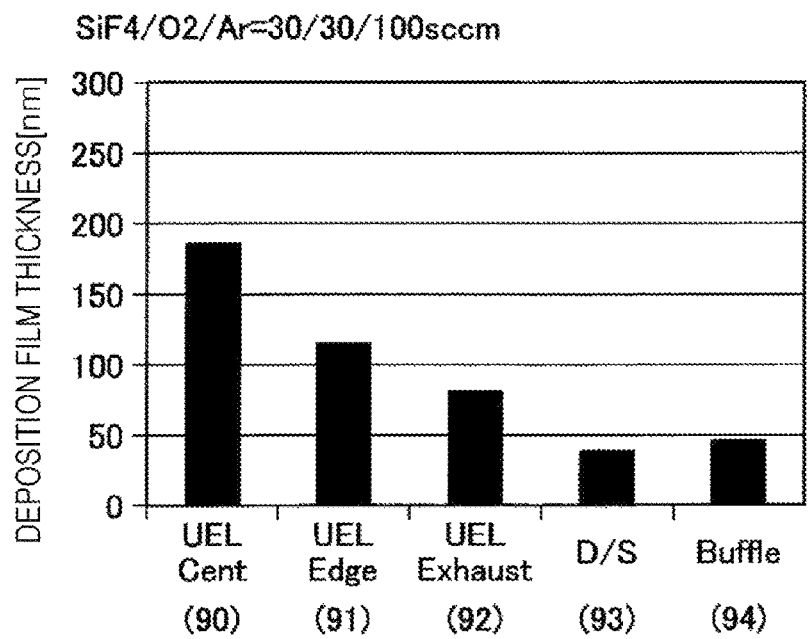
FIG. 4 is a view illustrating an example of a flow rate of a silicon-containing gas and a deposition amount.

FIG. 4 is a view illustrating an example of a flow rate of a silicon-containing gas and a deposition amount. FIG. 4 illustrates deposition film thicknesses at the measurement points 90 to 94 when $SiF_4$ is used as a silicon-containing gas, $O_2$ is used as an oxygen-containing gas, and Ar is used as a rare gas, and a flow rate ratio of $SiF_4/O_2/Ar$ is set as 30/30/100 sccm.

Figure 5:
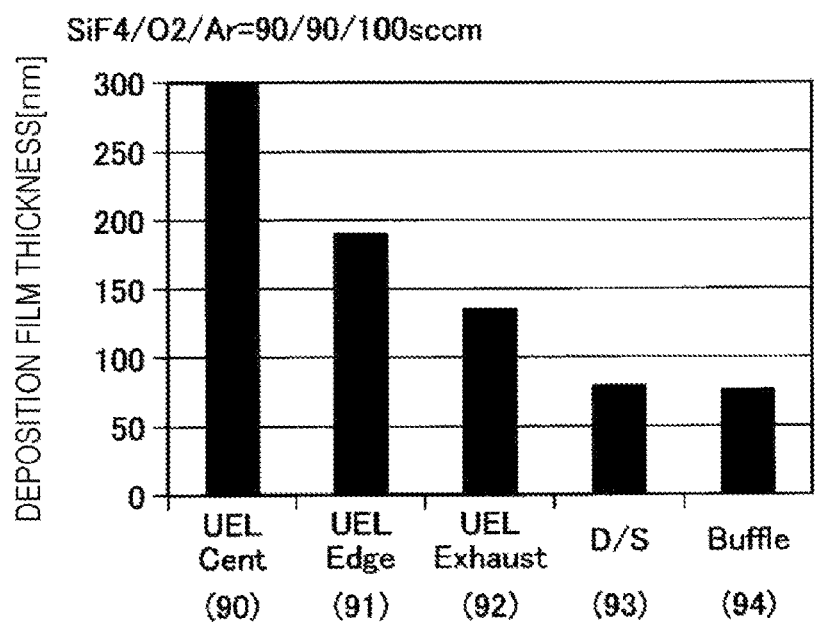
FIG. 5 is a view illustrating another example of a flow rate of a silicon-containing gas and a deposition amount.

FIG. 5 is a view illustrating another example of a flow rate of a silicon-containing gas and a deposition amount. FIG. 5 illustrates deposition film thicknesses at the measurement points 90 to 94 when $SiF_4$ is used as a silicon-containing gas, $O_2$ is used as an oxygen-containing gas, Ar is used as a rare gas, and a flow rate ratio of $SiF_4/O_2/Ar$ is set as 90/90/100 sccm.

Figure 6:
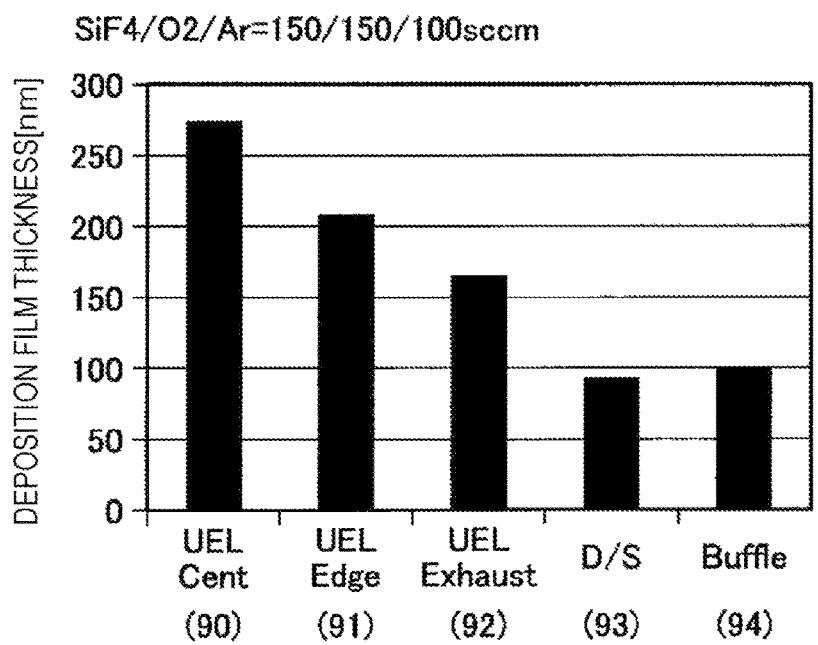
FIG. 6 is a view illustrating another example of a flow rate of a silicon-containing gas and a deposition amount.

FIG. 6 is a view illustrating another example of a flow rate of a silicon-containing gas and a deposition amount. FIG. 6 illustrates deposition film thicknesses at the measurement points 90 to 94 when $SiF_4$ is used as a silicon-containing gas, $O_2$ is used as an oxygen-containing gas, and Ar is used as a rare gas, and a flow rate ratio of $SiF_4/O_2/Ar$ is set as 150/150/100 sccm.

Figure 7:
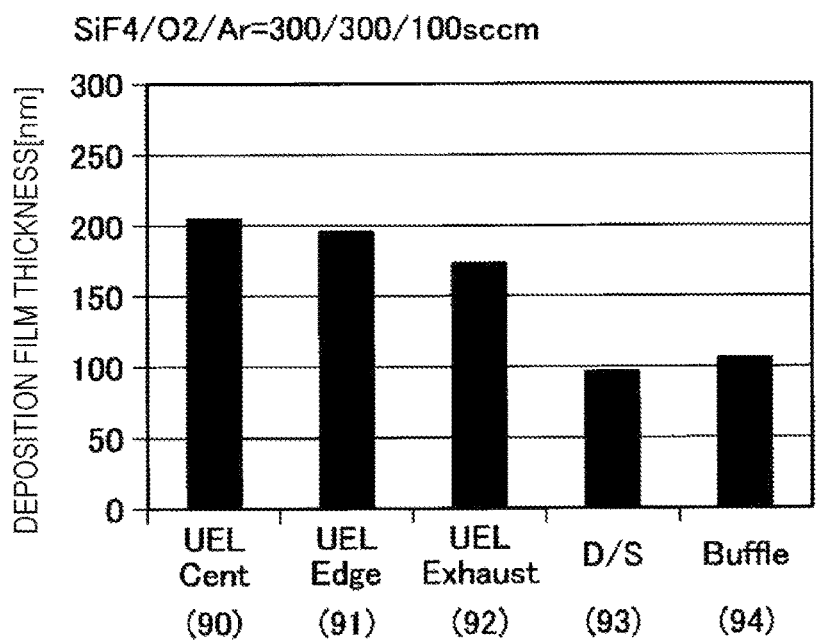
FIG. 7 is a view illustrating another example of a flow rate of a silicon-containing gas and a deposition amount.

FIG. 7 is a view illustrating another example of a flow rate of a silicon-containing gas and a deposition amount. FIG. 7 illustrates deposition film thicknesses at the measurement points 90 to 94 when $SiF_4$ is used as a silicon-containing gas, $O_2$ is used as an oxygen-containing gas, and Ar is used as a rare gas, and a flow rate ratio of $SiF_4/O_2/Ar$ is set as 300/300/100 sccm.

Figure 8:
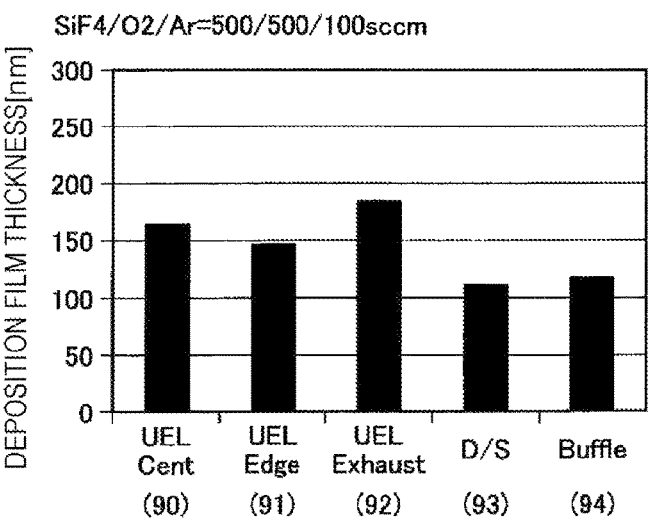
FIG. 8 is a view illustrating another example of a flow rate of a silicon-containing gas and a deposition amount.

FIG. 8 is a view illustrating another example of a flow rate of a silicon-containing gas and a deposition amount. FIG. 8 illustrates deposition film thicknesses at the measurement points 90 to 94 when $SiF_4$ is used as a silicon-containing gas, $O_2$ is used as an oxygen-containing gas, and Ar is used as a rare gas, and a flow rate ratio of $SiF_4/O_2/Ar$ is set as 500/500/100 sccm.

Figure 9:
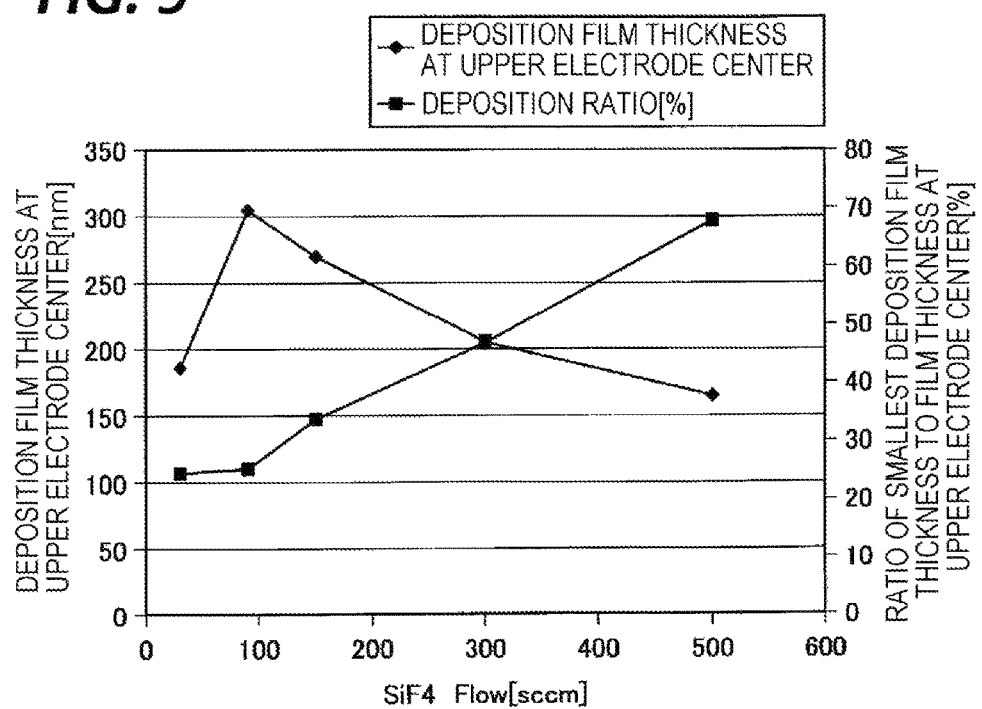
FIG. 9 is a view illustrating an example of a relationship between a flow rate of a silicon-containing gas and a film thickness ratio of deposition.

FIG. 9 is a view illustrating an example of a relationship between a flow rate of the silicon-containing gas and a film thickness ratio of deposition. FIG. 9 is a graph based on the graphs illustrated in FIGS. 4 to 8, in which the flow rate of the silicon-containing gas is set as a horizontal axis, and a film thickness of deposition at the upper electrode center, that is, the measurement point 90, and a ratio (a deposition ratio) of a film thickness of deposition at a measurement point having a smallest deposition film thickness among the measurement points 91 to 94 to a film thickness of deposition at the measurement point 90 are set as vertical axes. As illustrated in FIG. 9, when the flow rate of the silicon-containing gas is 150 sccm, the deposition ratio becomes 35%, and when the flow rate of the silicon-containing gas is 500 sccm, the deposition ratio becomes 68%. That is, the inside of the processing chamber 1 is changed from a feeding rate determining state to a reaction rate determining state according to an increase of the flow rate of the silicon-containing gas, and the amount of deposition generated on the surface of the in-chamber member is improved in uniformity according to an increase of the flow rate of the silicon-containing gas. As a result, when the flow rate of the silicon-containing gas is set to range from 150 sccm to 1000 sccm, more specifically from 300 sccm to 700 sccm, it becomes possible to improve the uniformity of the amount of deposition generated on the surface of the in-chamber member.

Figure 10:
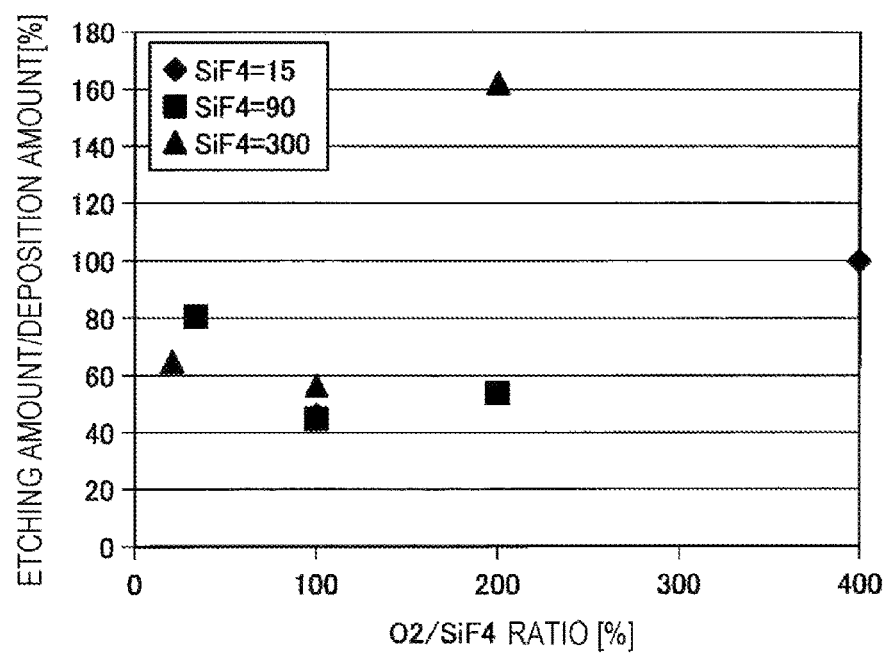
FIG. 10 is a view illustrating an example of a relationship between a flow rate ratio of an oxygen-containing gas to a silicon-containing gas and an etching amount.

FIG. 10 is a view illustrating an example of a relationship between a flow rate ratio of the oxygen-containing gas to the silicon-containing gas and an etching amount. Here, the etching amount refers to an amount of the silicon oxide film (deposition) etched by a plasma processing after the silicon oxide film is generated on the surface of the in-chamber member. FIG. 10 illustrates a plasma resistance of the silicon oxide film (deposition) when a ratio of the oxygen-containing gas to the silicon-containing gas is set as a horizontal axis, a ratio of an etching amount to a deposition amount (a film thickness of deposition) is set as a vertical axis, and the flow rate of the silicon-containing gas is 15 sccm, 90 sccm, and 300 sccm.

In the example of FIG. 10, in a case where the flow rate of the silicon-containing gas is 300 sccm, when the flow rate ratio of the oxygen-containing gas to the silicon-containing gas is 20%, that is, when the flow rate of the oxygen-containing gas is 60 sccm, and the flow rate of the silicon-containing gas is 300 sccm, the ratio of the etching amount to the deposition amount becomes 65%. That is, 65% of the deposition generated on the surface of the in-chamber member is etched. Also, when the flow rate ratio of the oxygen-containing gas to the silicon-containing gas is 100%, that is, when the flow rate of the oxygen-containing gas is 300 sccm and the flow rate of the silicon-containing gas is 300 sccm, the ratio of the etching amount to the deposition amount becomes 56%. That is, 56% of the deposition generated on the surface of the in-chamber member is etched. Also, when the flow rate ratio of the oxygen-containing gas to the silicon-containing gas is 200%, that is, when the flow rate of the oxygen-containing gas is 600 sccm, and the flow rate of the silicon-containing gas is 300 sccm, the ratio of the etching amount to the deposition amount becomes 160%. That is, 100% of the deposition generated on the surface of the in-chamber member is etched, and further the surface of the in-chamber member is etched. As a result, when the flow rate ratio of the oxygen-containing gas to the silicon-containing gas is set to range from 0.2 to 1.4, more specifically from 0.2 to 1.0, it becomes possible to improve a plasma resistance of the deposition amount deposition generated on the surface of the in-chamber member.

The description is returned to FIG. 2. Subsequently, the plasma processing apparatus performs a plasma processing step of performing a plasma processing on a workpiece carried into the processing chamber 1 by the plasma of a processing gas (step S102). The workpiece is, for example, a semiconductor wafer W on which the silicon oxide film is laminated. Also, the processing gas is, for example, HBr/NF$_3$.

Descriptions will be made by way of a more detailed example. The controller 60 of the plasma processing apparatus carries the workpiece into the processing chamber 1 through the carry-in/out port 74 and the gate valve 75, and places the carried workpiece on the electrostatic chuck 6. Then, the controller 60 supplies the processing gas into the processing chamber 1 from the processing gas supply source 15, and applies a high frequency power for plasma generation from the first high-frequency power source 10a, and a high frequency power for ion attraction from the second high-frequency power source 10b. As a result, the workpiece is subjected to the plasma processing.

Then, the plasma processing apparatus performs a removal step of removing the silicon oxide film from the surface of the in-chamber member by the plasma of a fluorine-containing gas after the workpiece is carried out of the processing chamber 1 (step S103). The fluorine-containing gas contains, for example, at least one of NF$_3$, SF$_6$, and CF$_4$. Also, the fluorine-containing gas may contain O$_2$.

Descriptions will be made by way of a more detailed example. The controller 60 of the plasma processing apparatus carries the workpiece out of the processing chamber 1 through the carry-in/out port 74 and the gate valve 75. Then, the controller 60 supplies the fluorine-containing gas into the processing chamber 1 from the processing gas supply source 15, and applies a high frequency power for plasma generation from the first high-frequency power source 10a. Here, the controller 60 does not apply a high frequency power for ion attraction from the second high-frequency power source 10b. As a result, the silicon oxide is removed from the surface of the member within the processing chamber 1.

Figure 11:
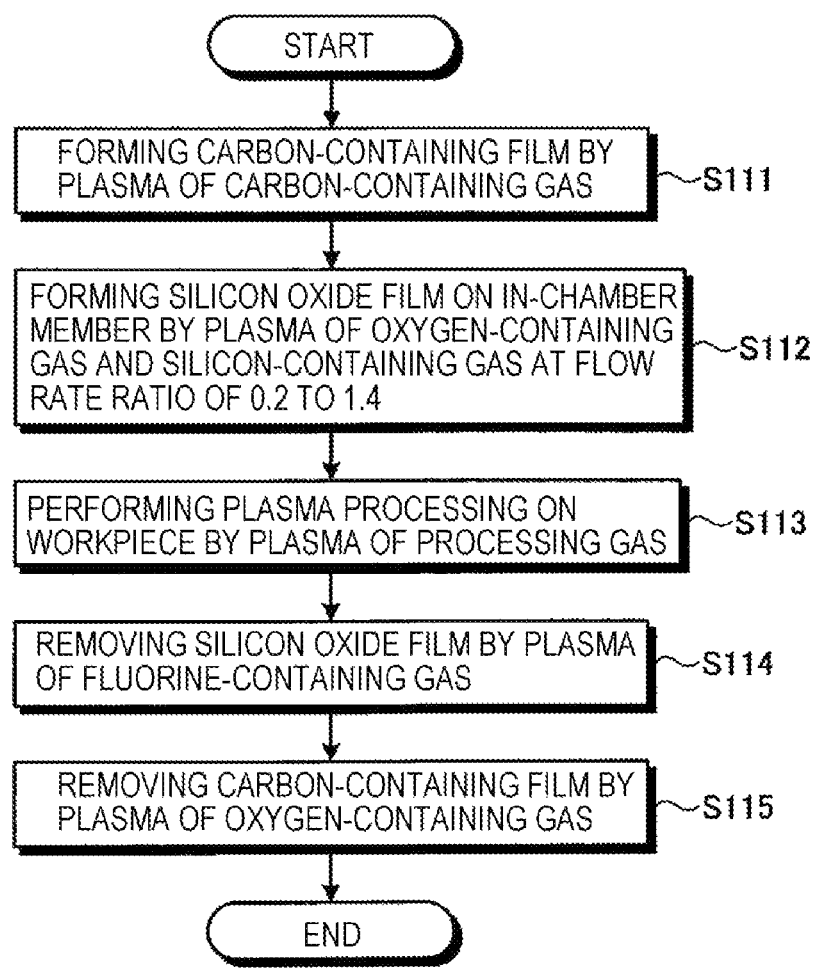
FIG. 11 is a flow chart illustrating another example of a processing flow of the plasma processing method by the plasma processing apparatus according to the present exemplary embodiment.

Then, descriptions will be made on another example of a processing flow of the plasma processing method by the plasma processing apparatus according to the present exemplary embodiment with reference to FIG. 11. FIG. 11 is a flow chart illustrating another example of a processing flow of the plasma processing method by the plasma processing apparatus according to the present exemplary embodiment. The processing flow of the plasma processing method illustrated in FIG. 11 further includes a film pre-forming step of forming a carbon-containing film on the surface of the in-chamber member by the plasma of a carbon-containing gas before the film forming step of the silicon oxide film.

As illustrated in FIG. 11, the plasma processing apparatus performs a film pre-forming step of forming the carbon-containing film on the surface of the in-chamber member by the plasma of the carbon-containing gas (step S111). The carbon-containing gas contains a gas represented by, for example, C$_x$H$_y$F$_z$ (in the formula, x, y and z represent integers, and (z−y)/x is 2 or less). Also, the carbon-containing gas may be a carbon-containing gas that contains, for example, at least one CH$_4$, C$_4$F$_8$, CHF$_3$, CH$_3$F and C$_2$H$_4$. The carbon-containing gas may further contain a rare gas. The rare gas is, for example, Ar or He. The plasma processing apparatus generates deposition that is the carbon-containing film on the surface of the in-chamber member by the film-pre-forming step.

The controller 60 of the plasma processing apparatus generates the plasma of the carbon-containing gas by supplying the carbon-containing gas into the processing chamber 1 from the processing gas supply source 15, and applying a high frequency power for plasma generation into the processing chamber 1 from the first high-frequency power source 10a. Here, the controller 60 does not apply a high frequency power for ion attraction from the second high-frequency power source 10b. As a result, the deposition that is the carbon-containing film is generated on the surface of the in-chamber member.

Then, the plasma processing apparatus performs a film forming step of forming a silicon oxide film on the surface of the in-chamber member by the plasma of an oxygen-containing gas and a silicon-containing gas in which the flow rate ratio of the oxygen-containing gas to the silicon-containing gas ranges from 0.2 to 1.4 (step S112). Also, details in step S112 are the same as those in step S101 as described above, and thus, descriptions thereof will be omitted.

Then, the plasma processing apparatus performs a plasma processing step of performing a plasma processing on a workpiece carried into the processing chamber 1 by the plasma of a processing gas (step S113). Also, details in step S113 are the same as those in step S102 as described above, and thus, descriptions thereof will be omitted.

Then, the plasma processing apparatus performs a first removal step of removing the silicon oxide film from the surface of the in-chamber member by the plasma of a fluorine-containing gas after the workpiece is carried out of the processing chamber 1 (step S114). Also, details in step S114 are the same as those in step S103 as described above, and thus, descriptions thereof will be omitted.

Then, the plasma processing apparatus performs a second removal step of removing the carbon-containing film from the surface of the in-chamber member by the plasma of an oxygen-containing gas (step S115). The oxygen-containing gas contains at least O$_2$, and may further contain a rare gas. The rare gas is, for example, Ar or He.

Descriptions will be made by way of a more detailed example. The controller 60 of the plasma processing apparatus supplies the oxygen-containing gas into the processing chamber 1 from the processing gas supply source 15 and applies a high frequency power for plasma generation from the first high-frequency power source 10a after the first removal step of removing the silicon oxide film. Here, the controller 60 does not apply a high frequency power for ion attraction from the second high-frequency power source 10b. As a result, the carbon-containing film is removed from the surface of the member within the processing chamber 1.

Figure 12:
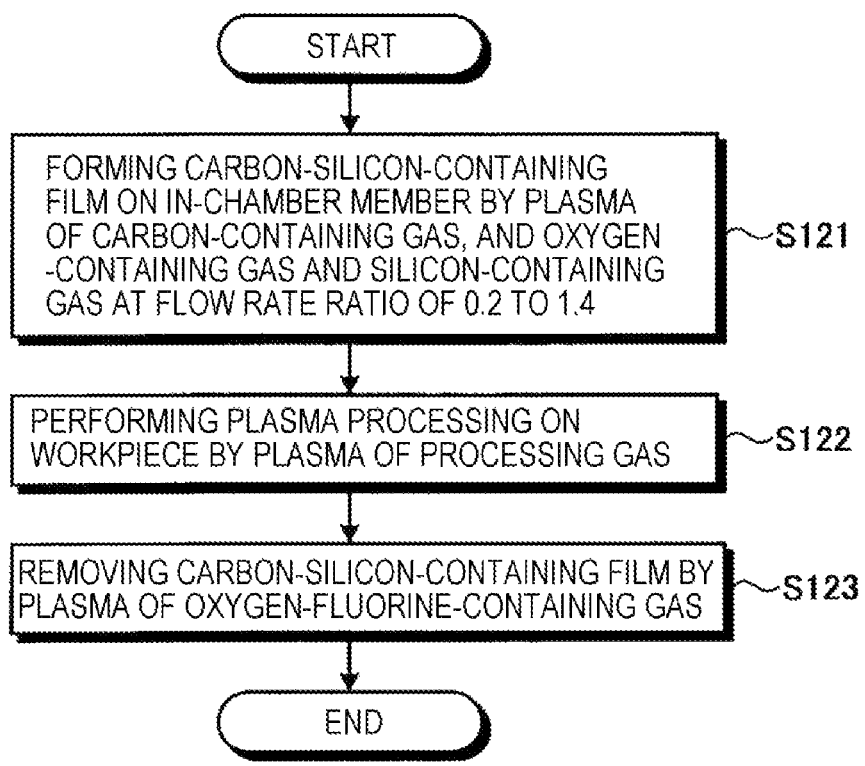
FIG. 12 is a flow chart illustrating another example of a processing flow of the plasma processing method by the plasma processing apparatus according to the present exemplary embodiment.

Then, descriptions will be made on another example of a processing flow of the plasma processing method by the plasma processing apparatus according to the present exemplary embodiment with reference to FIG. 12. FIG. 12 is a flow chart illustrating another example of a processing flow of the plasma processing method by the plasma processing apparatus according to the present exemplary embodiment.

As illustrated in FIG. 12, the plasma processing apparatus performs a film forming step of forming a carbon-silicon-containing film on the surface of the in-chamber member by the plasma of a carbon-containing gas, an oxygen-containing gas, and a silicon-containing gas in which the flow rate ratio of the oxygen-containing gas to the silicon-containing gas ranges from 0.2 to 1.4 (step S121). The carbon-containing gas contains a gas represented by, for example, C$_x$H$_y$F$_z$ (in the formula, x, y, and z represent integers, and (z−y)/x is 2 or less). Also, the carbon-containing gas may be a carbon-containing gas that contains, for example, at least one of CH$_4$, C$_4$F$_8$, CHF$_3$, CH$_3$F, and C$_2$H$_4$. The silicon-containing gas contains, for example, at least one of SiF$_4$ and SiCl$_4$. The carbon-containing gas and the silicon-containing gas may further contain a rare gas. The rare gas is, for example, Ar or He.

The plasma processing apparatus generates a deposition that is a carbon-silicon-containing film, on the surface of the in-chamber member by the film forming step. The controller 60 of the plasma processing apparatus generates the plasma of the carbon-containing gas, the oxygen-containing gas, and the silicon-containing gas by supplying the carbon-containing gas, the oxygen-containing gas, and the silicon-containing gas into the processing chamber 1 from the processing gas supply source 15, and applying a high frequency power for plasma generation into the processing chamber 1 from the first high-frequency power source 10a. Here, the controller 60 does not apply a high frequency power for ion attraction from the second high-frequency power source 10b. As a result, the deposition that is the carbon-silicon-containing film is generated on the surface of the in-chamber member.

Then, the plasma processing apparatus performs a plasma processing step of performing a plasma processing on a workpiece carried into the processing chamber 1 by the plasma of a processing gas (step S122). Also, details in step S122 are the same as those in step S102 as described above, and thus, descriptions thereof will be omitted.

Then, the plasma processing apparatus performs a removal step of removing the carbon-silicon-containing film from the surface of the in-chamber member by the plasma of an oxygen-fluorine-containing gas after the workpiece is carried out of the processing chamber 1 (step S123). The oxygen-fluorine-containing gas contains, for example, $O_2$, and at least one of $NF_3$, $SF_6$, and $CF_4$.

Descriptions will be made by way of a more detailed example. The controller 60 of the plasma processing apparatus carries the workpiece out of the processing chamber 1 through the carry-in/out port 74 and the gate valve 75. Then, the controller 60 supplies the oxygen-fluorine-containing gas into the processing chamber 1 from the processing gas supply source 15, and applies a high frequency power for plasma generation from the first high-frequency power source 10a. Here, the controller 60 does not apply a high frequency power for ion attraction from the second high-frequency power source 10b. As a result, the carbon-silicon-containing film is removed from the surface of the member within the processing chamber 1.

Figure 13:
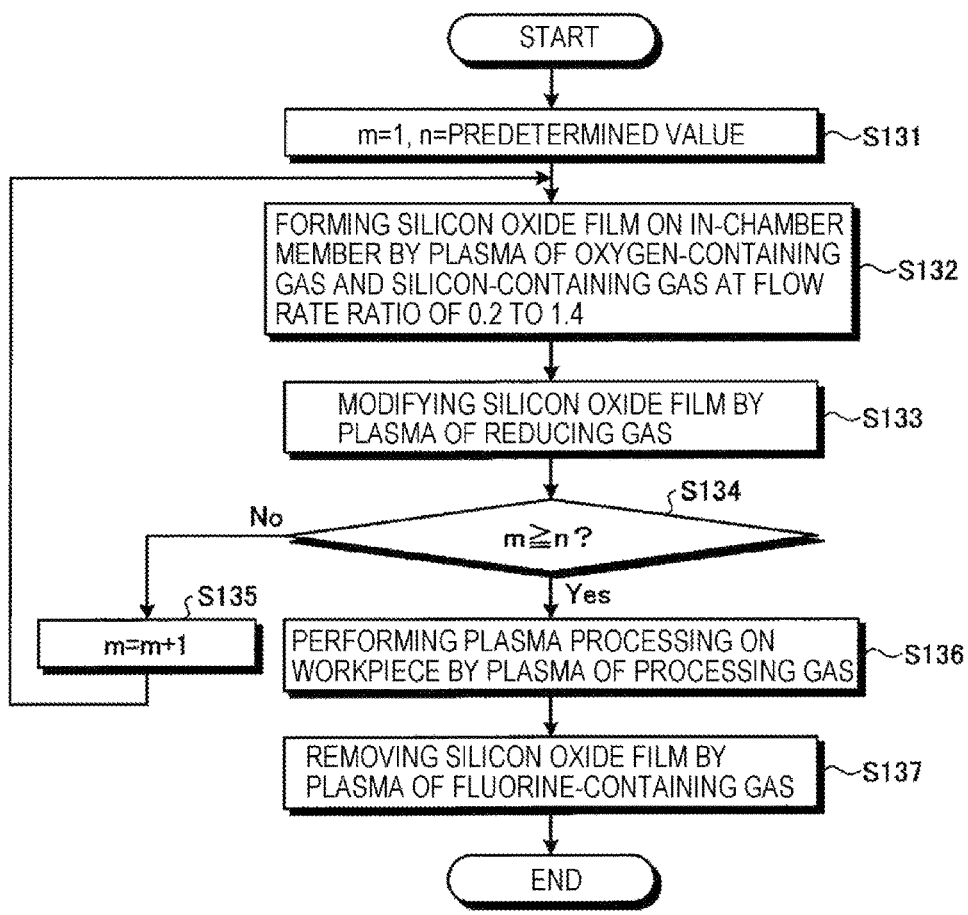
FIG. 13 is a flow chart illustrating another example of a processing flow of the plasma processing method by the plasma processing apparatus according to the present exemplary embodiment.

Next, descriptions will be made on another example of a processing flow of the plasma processing method by the plasma processing apparatus according to the present exemplary embodiment with reference to FIG. 13. FIG. 13 is a flow chart illustrating another example of a processing flow of the plasma processing method by the plasma processing apparatus according to the present exemplary embodiment. The processing flow of the plasma processing method illustrated in FIG. 13 further includes a modification step of modifying the silicon oxide film by the plasma of a reducing gas after the film forming step of the silicon oxide film.

As illustrated in FIG. 13, the plasma processing apparatus sets initial values to a variable m for counting and a variable n for a number of repetition times used to repeat the steps. The plasma processing apparatus sets, for example, "1" to the variable m, and sets, for example, "40" as a predetermined value to the variable n (step S131). Also, the predetermined value to be set to the variable n is an arbitrary value. Also, when the predetermined value is, for example, "1," each of the film forming step and the modification step is performed once, and is not repeated.

Then, the plasma processing apparatus performs a film forming step of forming a silicon oxide film on the surface of the in-chamber member by the plasma of an oxygen-containing gas and a silicon-containing gas in which the flow rate ratio of the oxygen-containing gas to the silicon-containing gas ranges from 0.2 to 1.4 (step S132). Also, details in step S132 are the same as those in step S101 as described above, and thus, descriptions thereof will be omitted.

Then, the plasma processing apparatus performs a modification step of modifying the formed silicon oxide film by the plasma of the reducing gas (step S133). The reducing gas contains, for example, at least one of $H_2$, $CH_4$, and $C_3H_6$. The reducing gas may further contain a rare gas. The rare gas is, for example, Ar or He. The plasma processing apparatus modifies the silicon oxide film (deposition) formed on the surface of the in-chamber member by the modification step.

The controller 60 of the plasma processing apparatus generates the plasma of the reducing gas by supplying the reducing gas into the processing chamber 1 from the processing gas supply source 15, and applying a high frequency power for plasma generation into the processing chamber 1 from the first high-frequency power source 10a. Here, the controller 60 does not apply a high frequency power for ion attraction from the second high-frequency power source 10b. As a result, the silicon oxide film formed on the surface of the in-chamber member is modified.

Then, the plasma processing apparatus determines whether the film forming step and the modification step have been repeated a preset number of times, that is, whether the variable m is equal to or larger than the variable n (step S134). When the variable m is smaller than the variable n (step S134: No), the plasma processing apparatus increases the variable m by one (1) (step S135), and returns to step S132 to repeat the film forming step and the modification step. When the variable m is equal to or larger than the variable n (step S134: Yes), the plasma processing apparatus proceeds to a plasma processing step.

Figure 14:
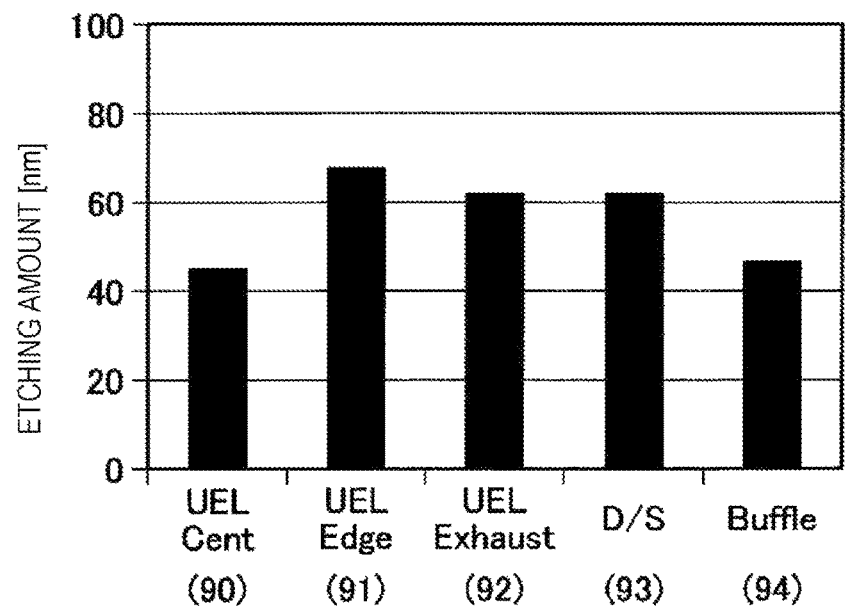
FIG. 14 is a view illustrating an example of an etching amount of a silicon oxide film.

FIG. 14 is a view illustrating an example of an etching amount of a silicon oxide film. FIG. 14 illustrates an etching amount of the silicon oxide film as illustrated in FIG. 7, that is, an etching amount of a silicon-containing film (deposition) at the measurement points 90 to 94 under predetermined plasma-resistant conditions. Here, as the predetermined plasma-resistant conditions, 20 mT, 800 W, 30 sec for $CF_4$ gas, 60 sec for $H_2/N_2$ gas, 30 sec for $CF_4$ gas, and 30 sec for $O_2$/Ar gas are employed. Also, the silicon oxide film as illustrated in FIG. 7 is formed under film forming conditions where $SiF_4$ is used as a silicon-containing gas, $O_2$ is used as an oxygen-containing gas, Ar is used as a rare gas, and a flow rate ratio of $SiF_4/O_2$/Ar is 300/300/100 sccm (20 mT, 800 W, and 2 min).

Figure 15:
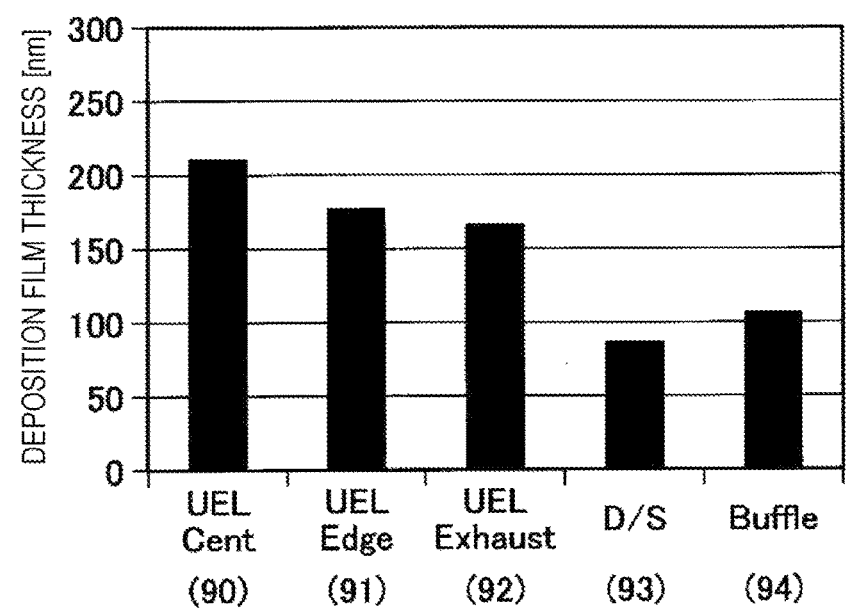
FIG. 15 is a view illustrating an example of a deposition amount of a modified silicon oxide film.

FIG. 15 is a view illustrating an example of a deposition amount of a modified silicon oxide film. FIG. 15 illustrates deposition film thicknesses at the measurement points 90 to 94 when a film forming step and a modification step are repeated until a total time of a film forming condition becomes 2 min, that is, when the film forming step and the modification step are repeated 40 times (e.g., 3 sec is set for the film forming step, 5 sec is set for the modification step, and a variable n is set as 40). Here, various conditions for the film forming step and the modification step will be described. The film forming step uses $SiF_4$ as the silicon-containing gas, $O_2$ as the oxygen-containing gas, and Ar as the rare gas. Also, the modification step uses $H_2$ as the reducing gas, and Ar as the rare gas. Also, as the film forming condition, a flow rate ratio of $SiF_4/O_2$/Ar is set as 300/300/100 sccm (20 mT, 800 W, 3 sec) and as the modification condition, a flow rate ratio is set as 100/100 sccm (10 mT, 800 W, 5 sec). Here, it is desirable that the processing time for the modification step is longer than the film forming step.

Figure 16:
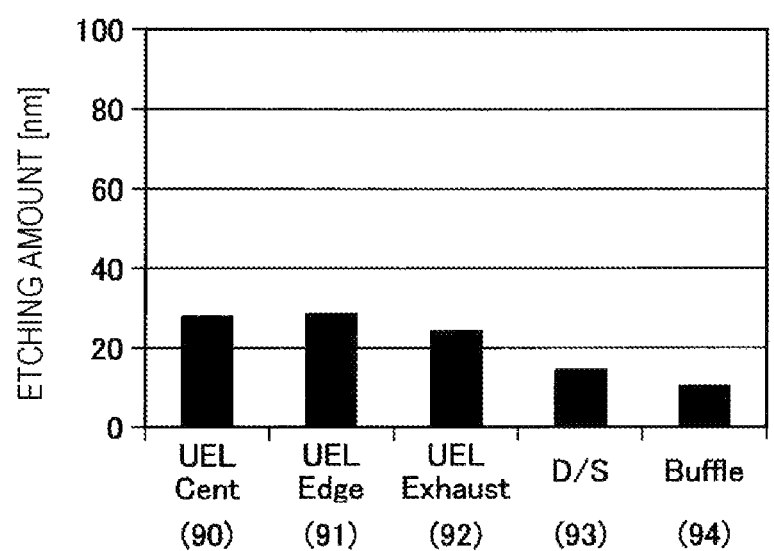
FIG. 16 is a view illustrating an example of an etching amount of a modified silicon oxide film.

FIG. 16 is a view illustrating an example of an etching amount of a modified silicon oxide film. FIG. 16 illustrates an etching amount of the silicon oxide film as illustrated in FIG. 15, that is, an etching amount of a silicon-containing film (deposition) at the measurement points 90 to 94 under predetermined plasma-resistant conditions. Here, as the predetermined plasma-resistant conditions, 20 mT, 800 W, 30 sec for $CF_4$ gas, 60 sec for $H_2/N_2$ gas, 30 sec for $CF_4$ gas, and 30 sec for $O_2/Ar$ gas are employed.

FIG. 17 is a view illustrating an example of a deposition amount and an etching amount according to whether a silicon oxide film is modified or non-modified. FIG. 17 illustrates deposition amounts and etching amounts at the measurement points 90 to 94 in a case of each of modification and non-modification. In the comparison between modification and non-modification, a change of the deposition amount is small but the etching amount is reduced. That is, a modified silicon oxide film is increased in the plasma resistance as compared to a non-modified silicon oxide film. For example, the etching amount at the measurement point 90 is reduced from 45 nm to 28 nm.

Figure 18:
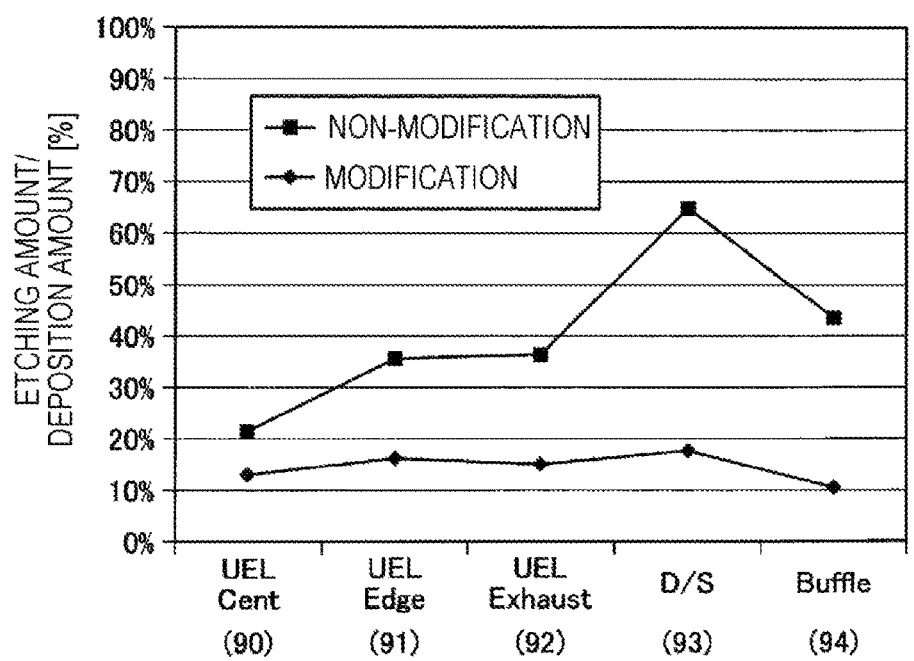
FIG. 18 is a view illustrating an example of a relationship between an etching amount and a deposition amount according to whether a silicon oxide film is modified or non-modified.

FIG. 18 is a view illustrating an example of a relationship between an etching amount and a deposition amount according to whether a silicon oxide film is modified or non-modified. FIG. 18 illustrates a ratio of an etching amount to a deposition amount at the measurement points 90 to 94 in a case of each of modification and non-modification. As illustrated in FIG. 18, it can be found that the modified silicon oxide film is reduced in the ratio of the etching amount to the deposition amount at the measurement points 90 to 94 and is increased in the plasma resistance, as compared to the non-modified silicon oxide film.

Figure 19:
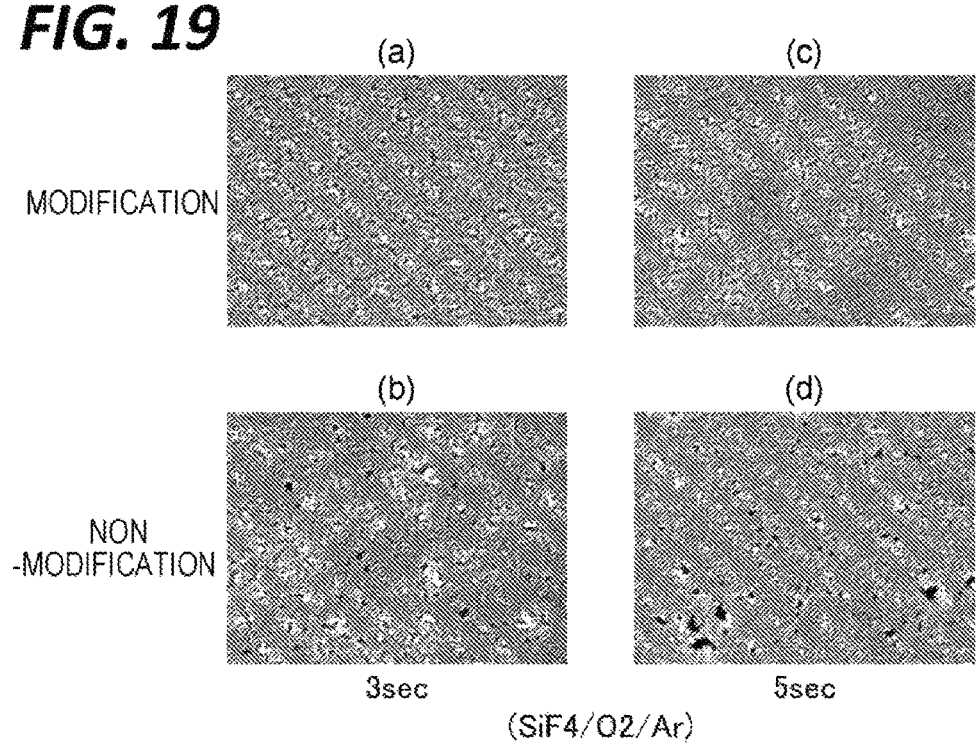
FIG. 19 ((a) to (d)) is a view illustrating examples of a surface of a silicon oxide film according to modification or non-modification.

FIG. 19 is a view illustrating examples of a surface of a silicon oxide film according to modification or non-modification. In FIG. 19, (a) and (b) illustrate a case where a film forming step by $SiF_4/O_2/Ar$ for 3 sec has been performed 40 times. In FIG. 19, (c) and (d) illustrate a case where the same film forming step for 5 sec has been performed 24 times. Also, in FIG. 19, (a) and (c) illustrate a case where a modification step by $H_2/Ar$ for 10 sec has been performed per the film forming step. In FIG. 19, (b) and (d) illustrate a case where the same modification step has not been performed. In the comparison between respective images of (a) to (d) of FIG. 19, it can be found that the shorter the time of the film forming step, that is, the thinner the silicon oxide film, the more the modification effect of the silicon oxide film.

Figure 20:
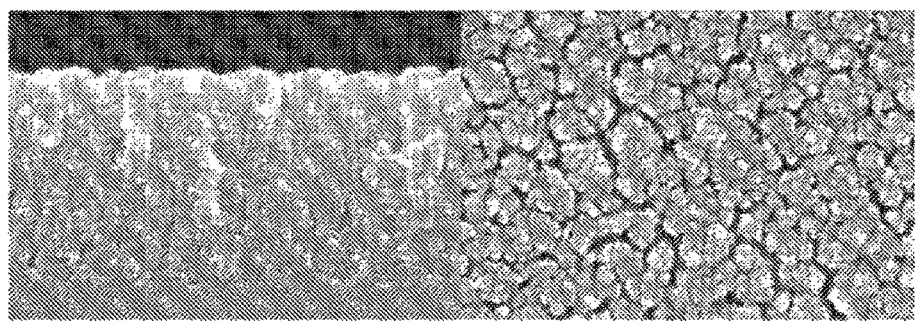
FIG. 20 ((a) and (b)) is a view illustrating an example of a cross-section and a surface of a silicon oxide film after deposition when modification is not performed.
Figure 21:
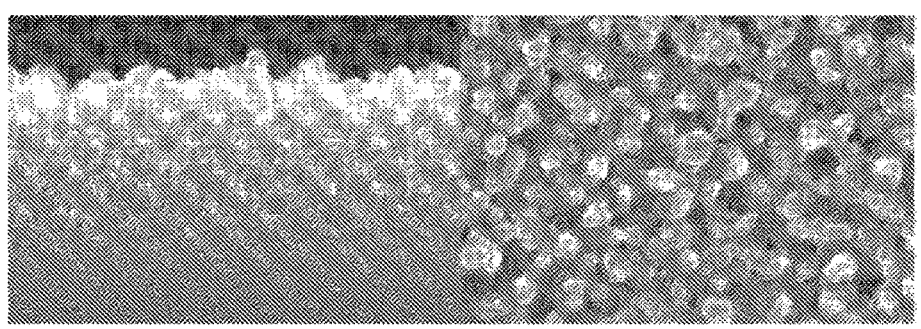
FIG. 21 ((a) and (b)) is a view illustrating an example of a cross-section and a surface of a silicon oxide film after a plasma processing when modification is not performed.

FIG. 20 is a view illustrating an example of a cross-section and a surface of a silicon oxide film after deposition when modification is not performed. In FIG. 20, (a) illustrates an example of a cross-section of a deposition at the measurement point 90, and (b) illustrates an example of a surface of a deposition at the measurement point 90. FIG. 21 is a view illustrating an example of a cross-section and a surface of a silicon oxide film after a plasma processing when modification is not performed. In FIG. 21, (a) illustrates an example of a cross-section of a deposition at the measurement point 90 after the plasma processing, and (b) illustrates an example of a surface of a deposition at the measurement point 90 after the plasma processing. In the comparison between FIGS. 20 and 21, it can be found that the deposition at the measurement point 90 is etched by the plasma processing, and thus, the surface state becomes rough.

As illustrated in FIGS. 14 to 21, it can be found that the modified silicon oxide film is reduced in an etching amount by the plasma processing, and is formed as a highly plasma-resistant silicon oxide film as compared to the non-modified silicon oxide film. As described above, by performing a modification step after a film forming step, more specifically by repeating the film forming step and the modification step, it becomes possible to improve a plasma resistance of the silicon oxide film (deposition) generated on the surface of the in-chamber member.

The description is returned to FIG. 13. Subsequently, the plasma processing apparatus performs a plasma processing step of performing a plasma processing on a workpiece carried into the processing chamber 1 by the plasma of a processing gas (step S136). Also, details in step S136 are the same as those in step S102 as described above, and thus, descriptions thereof will be omitted.

Then, the plasma processing apparatus performs a removal step of removing the silicon oxide film from the surface of the in-chamber member by the plasma of a fluorine-containing gas after the workpiece is carried out of the processing chamber 1 (step S137). Also, details in step S137 are the same as those in step S103 as described above, and thus, descriptions thereof will be omitted.

Figure 22:
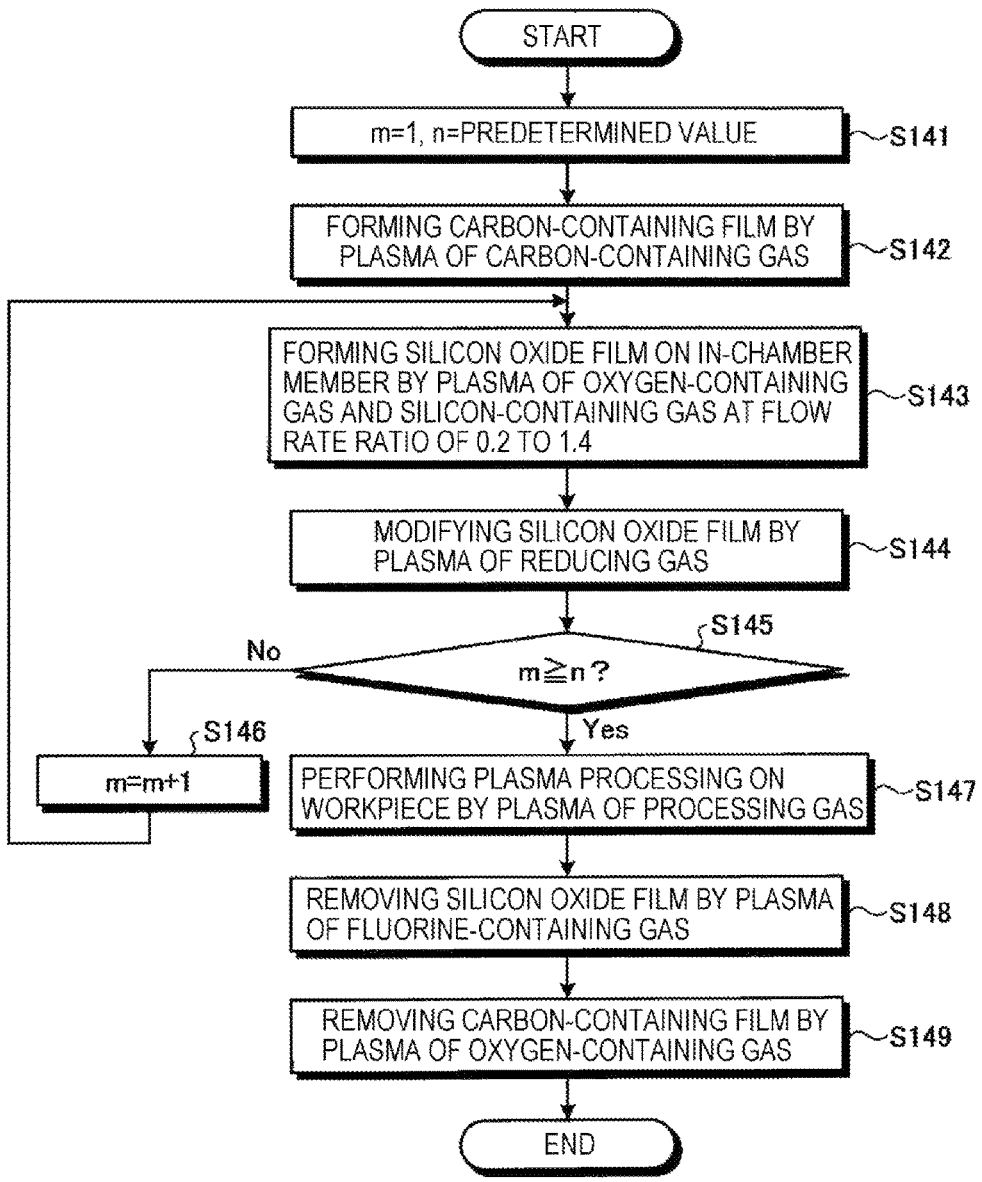
FIG. 22 is a flow chart illustrating another example of a processing flow of the plasma processing method by the plasma processing apparatus according to the present exemplary embodiment.

Then, descriptions will be made on another example of a processing flow of the plasma processing method by the plasma processing apparatus according to the present exemplary embodiment with reference to FIG. 22. FIG. 22 is a flow chart illustrating another example of a processing flow of the plasma processing method by the plasma processing apparatus according to the present exemplary embodiment. The processing flow of the plasma processing method illustrated in FIG. 22 further includes a film pre-forming step of forming a carbon-containing film on the surface of the in-chamber member by the plasma of a carbon-containing gas before the film forming step of the silicon oxide film, and a modification step of modifying the silicon oxide film by the plasma of a reducing gas after the film forming step of the silicon oxide film.

As illustrated in FIG. 22, the plasma processing apparatus sets initial values to a variable m for counting and a variable n for a number of repetition times used to repeat the steps. The plasma processing apparatus sets, for example, "1" to the variable m, and sets, for example, "40" as a predetermined value to the variable n (step S141).

Then, the plasma processing apparatus performs a film pre-forming step of forming the carbon-containing film on the surface of the in-chamber member by the plasma of the carbon-containing gas (step S142). Also, details in step S142 are the same as those in step S111 as described above, and thus, descriptions thereof will be omitted.

Then, the plasma processing apparatus performs a film forming step of forming a silicon oxide film on the surface of the in-chamber member by the plasma of an oxygen-containing gas and a silicon-containing gas in which the flow rate ratio of the oxygen-containing gas to the silicon-containing gas ranges from 0.2 to 1.4 (step S143). Also, details in step S143 are the same as those in step S101 as described above, and thus, descriptions thereof will be omitted.

Then, the plasma processing apparatus performs a modification step of modifying the formed silicon oxide film by the plasma of the reducing gas (step S144). Also, details in step S144 are the same as those in step S133 as described above, and thus, descriptions thereof will be omitted.

Then, the plasma processing apparatus determines whether the film forming step and the modification step have been repeated a preset number of times, that is, the variable m is equal to or larger than the variable n (step S145). When the variable m is smaller than the variable n (step S145: No), the plasma processing apparatus increases the variable m by one (1) (step S146), and returns to step S143 to repeat the film forming step and the modification step. When the variable m is equal to or larger than the variable n (step S145: Yes), the plasma processing apparatus proceeds to a plasma processing step.

Then, the plasma processing apparatus performs a plasma processing step of performing a plasma processing on a workpiece carried into the processing chamber 1 by the plasma of a processing gas (step S147). Also, details in step S147 are the same as those in step S102 as described above, and thus, descriptions thereof will be omitted.

Then, the plasma processing apparatus performs a first removal step of removing the silicon oxide film from the surface of the in-chamber member by the plasma of a fluorine-containing gas after the workpiece is carried out of the processing chamber 1 (step S148). Also, details in step S148 are the same as those in step S103 as described above, and thus, descriptions thereof will be omitted.

Then, the plasma processing apparatus performs a second removal step of removing the carbon-containing film from the surface of the in-chamber member by the plasma of an oxygen-containing gas (step S149). Also, details in step S149 are the same as those in step S115 as described above, and thus, descriptions thereof will be omitted.

Figure 23:
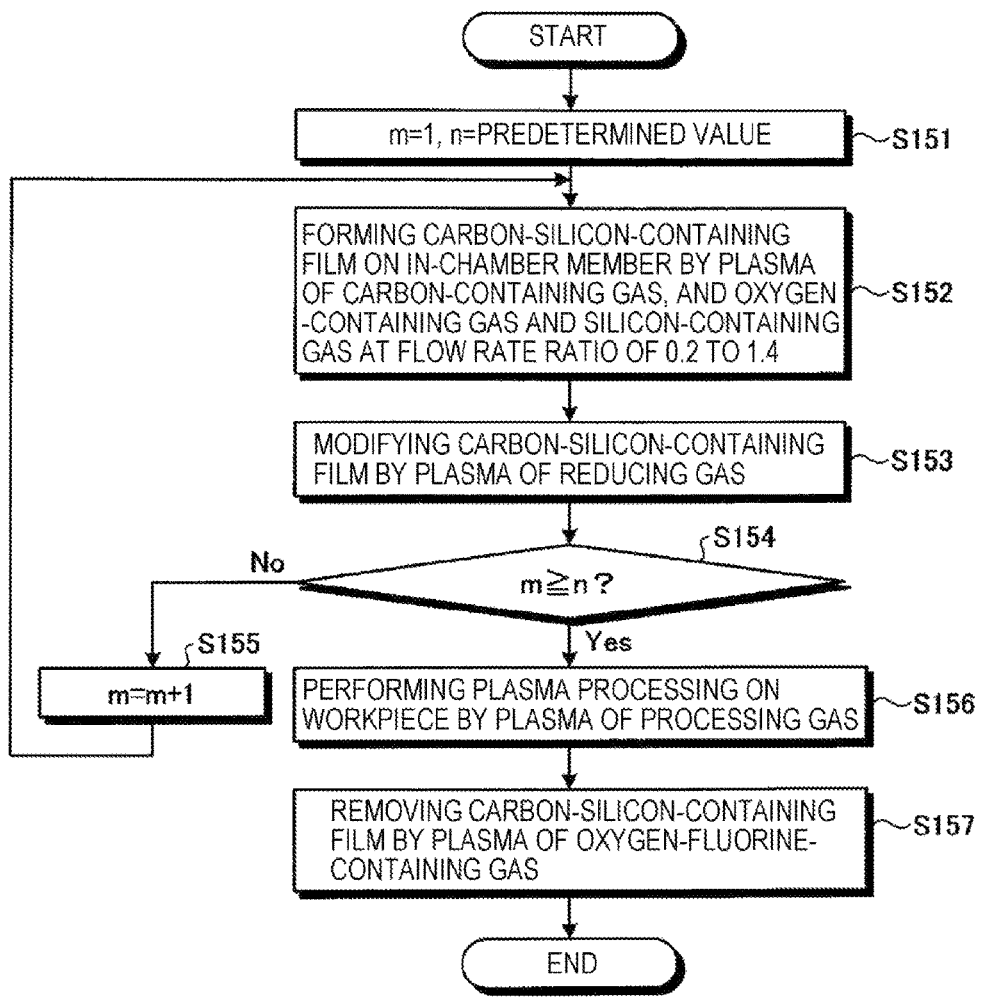
FIG. 23 is a flow chart illustrating another example of a processing flow of the plasma processing method by the plasma processing apparatus according to the present exemplary embodiment.

Then, descriptions will be made on another example of a processing flow of the plasma processing method by the plasma processing apparatus according to the present exemplary embodiment with reference to FIG. 23. FIG. 23 is a flow chart illustrating another example of a processing flow of the plasma processing method by the plasma processing apparatus according to the present exemplary embodiment. The processing flow of the plasma processing method illustrated in FIG. 23 further includes a modification step of modifying a carbon-silicon-containing film by the plasma of a reducing gas after the film forming step of the carbon-silicon-containing film.

As illustrated in FIG. 23, the plasma processing apparatus sets initial values to a variable m for counting and a variable n for a number of repetition times used to repeat the steps. The plasma processing apparatus sets, for example, "1" to the variable m, and sets, for example, "40" as a predetermined value to the variable n (step S151).

Then, the plasma processing apparatus performs a film forming step of forming a carbon-silicon-containing film on the surface of the in-chamber member by the plasma of a carbon-containing gas, an oxygen-containing gas and a silicon-containing gas in which the flow rate ratio of the oxygen-containing gas to the silicon-containing gas ranges from 0.2 to 1.4 (step S152). Also, details in step S152 are the same as those in step S121 as described above, and thus, descriptions thereof will be omitted.

Then, the plasma processing apparatus performs a modification step of modifying the formed carbon-silicon-containing film by the plasma of the reducing gas (step S153). Also, details in step S153 are the same as those in step S133 as described above, and thus, descriptions thereof will be omitted.

Then, the plasma processing apparatus determines whether the film forming step and the modification step have been repeated a preset number of times, that is, the variable m is equal to or larger than the variable n (step S154). When the variable m is smaller than the variable n (step S154: No), the plasma processing apparatus increases the variable m by one (1) (step S155), and returns to step S152 to repeat the film forming step and the modification step. When the variable m is equal to or larger than the variable n (step S154: Yes), the plasma processing apparatus proceeds to a plasma processing step.

Then, the plasma processing apparatus performs a plasma processing step of performing a plasma processing on a workpiece carried into the processing chamber 1 by the plasma of a processing gas (step S156). Also, details in step S156 are the same as those in step S102 as described above, and thus, descriptions thereof will be omitted.

Then, the plasma processing apparatus performs a removal step of removing the carbon-silicon-containing film from the surface of the in-chamber member by the plasma of an oxygen-fluorine-containing gas after the workpiece is carried out of the processing chamber 1 (step S157). Also, details in step S157 are the same as those in step S123 as described above, and thus, descriptions thereof will be omitted.

As described above, according to the present exemplary embodiment, a silicon oxide film is formed on the surface of a member within a chamber by the plasma of an oxygen-containing gas and a silicon-containing gas in which the flow rate ratio of the oxygen-containing gas to the silicon-containing gas ranges from 0.2 to 1.4 before a workpiece is subjected to a plasma processing. Therefore, according to the present exemplary embodiment, it becomes possible to improve a plasma resistance of the silicon oxide film (deposition) generated on the surface of the in-chamber member. As a result, as compared to a method in which the gas flow rate ratio of the oxygen-containing gas to the silicon-containing gas is 1.7 or more, a dense and high-quality silicon oxide film may be formed, and thus, it becomes possible to improve a plasma resistance. Also, since the film forming step is performed before the workpiece is subjected to the plasma processing, it becomes possible to increase a plasma resistance of the in-chamber member, and to avoid members from being worn or pollutants from being scattered from the members.

Also, according to the present exemplary embodiment, the silicon oxide film is removed from the surface of the in-chamber member by the plasma of a fluorine-containing gas after the workpiece that has been subjected to the plasma processing is carried out of the processing chamber 1. As a result, it becomes possible to clean the surface of the in-chamber member.

Also, according to the present exemplary embodiment, in the film forming step of forming the silicon oxide film, the flow rate of the silicon-containing gas is set to 150 sccm or more. As a result, it becomes possible to improve uniformity in the amount of deposition generated on the surface of the in-chamber member.

Also, according to the present exemplary embodiment, the silicon-containing gas contains at least one of $SiF_4$ and $SiCl_4$. As a result, it becomes possible to improve a plasma resistance of the silicon oxide film (deposition) generated on the surface of the in-chamber member.

Also, according to the present exemplary embodiment, a modification step is further included in which after the film forming step of forming the silicon oxide film, the silicon oxide film is modified by the plasma of a reducing gas that contains at least one of $H_2$, $CH_4$ and $C_3H_6$. As a result, the amount of halogen remaining in the silicon oxide film is reduced, and a denser and high-quality silicon oxide film may be formed. Thus it becomes possible to improve a plasma resistance.

Also, according to the present exemplary embodiment, a film pre-forming step is further included in which a carbon-containing film is formed on the surface of the member by the plasma of a carbon-containing gas before the film forming step of forming the silicon oxide film. As a result, when the silicon oxide film is removed from the surface of the in-chamber member by the plasma of the fluorine-containing gas, the fluorine-containing gas does not come in contact with the surface of the in-chamber member. Thus, it becomes possible to further suppress deterioration and wear-out of the surface of the in-chamber member.

Also, according to the present exemplary embodiment, the carbon-containing gas contains a gas represented by $C_xH_yF_z$ (in the formula, x, y, and z represent integers, and $(z-y)/x$ is 2 or less). As a result, it becomes possible to further suppress deterioration and wear-out of the surface of the in-chamber member.

Also, according to the present exemplary embodiment, the carbon-containing gas contains at least one of $CH_4$, $C_4F_8$, $CHF_3$, $CH_3F$ and $C_2H_4$. As a result, it becomes possible to further suppress deterioration and wear-out of the surface of the in-chamber member.

Also, according to the present exemplary embodiment, the removal step includes a first removal step of removing the silicon oxide film from the surface of the member by the plasma of the fluorine-containing gas, and a second removal step of removing the carbon-containing film from the surface of the member by the plasma of the oxygen-containing gas. As a result, it becomes possible to further clean the surface of the in-chamber member.

Also, according to the present exemplary embodiment, a carbon-silicon-containing film is formed on the surface of a member within a chamber by the plasma of a carbon-containing gas, an oxygen-containing gas and a silicon-containing gas in which the flow rate ratio of the oxygen-containing gas to the silicon-containing gas ranges from 0.2 to 1.4 before a workpiece is subjected to a plasma processing. As a result, it becomes possible to further suppress deterioration and wear-out of the surface of the in-chamber member.

Also, according to the present exemplary embodiment, the carbon-silicon-containing film is removed from the surface of the member by the plasma of an oxygen-fluorine-containing gas after the workpiece that has been subjected to the plasma processing is carried out of the processing chamber 1. As a result, it becomes possible to more efficiently clean the surface of the in-chamber member.

Also, according to the present exemplary embodiment, the carbon-containing gas contains a gas represented by $C_xH_yF_z$ (in the formula, x, y, and z represent integers, and $(z-y)/x$ is 2 or less), and the silicon-containing gas contains at least one of $SiF_4$ and $SiCl_4$. As a result, it becomes possible to improve a plasma resistance of the carbon-silicon-containing film (deposition) generated on the surface of the in-chamber member and suppress deterioration and wear-out of the surface of the in-chamber member.

Also, according to the present exemplary embodiment, the carbon-containing gas contains at least one of $CH_4$, $C_4F_8$, $CHF_3$, $CH_3F$ and $C_2H_4$. As a result, it becomes possible to improve a plasma resistance of the carbon-silicon-containing film (deposition) generated on the surface of the in-chamber member and suppress deterioration and wear-out of the surface of the in-chamber member.

Also, according to the present exemplary embodiment, a modification step is further included in which after the film forming step of forming the carbon-silicon-containing film, the carbon-silicon-containing film is modified by the plasma of a reducing gas that contains at least one of $H_2$, $CH_4$ and $C_3H_6$. As a result, the amount of halogen remaining in the carbon-silicon-containing film is reduced, and a denser and high-quality carbon-silicon-containing film may be formed. Thus it becomes possible to suppress deterioration and wear-out of the surface of the in-chamber member.

Another Exemplary Embodiment

As described above, the plasma processing method and the plasma processing apparatus according to the present exemplary embodiment have been described, but an exemplary embodiment is not limited thereto. Hereinafter, another exemplary embodiment will be described.

(Bias Voltage)

For example, a bias voltage may be applied in the film forming step. That is, the controller 60 generates the plasma of the oxygen-containing gas and the silicon-containing gas by supplying the oxygen-containing gas and the silicon-containing gas into the processing chamber 1 from the processing gas supply source 15, and applying a high frequency power for plasma generation into the processing chamber 1 from the first high-frequency power source 10a, in a film forming step. Here, the controller 60 applies a high frequency power for ion attraction to the placing table 2 from the second high-frequency power source 10b, thereby applying a bias voltage to the placing table 2. Then, ions in the plasma are attracted toward the placing table 2. As a result, as compared to a method in which a bias voltage is not applied, it becomes possible to control more precisely the thickness of a film on the member.

| Description of Symbols | |
|---|---|
| 1: processing chamber | 2: placing table |
| 2a: substrate | 2b: coolant flow path |
| 2c: coolant inlet pipe | 2d: coolant outlet pipe |
| 3: insulating plate | 3a: inner wall member |
| 4: support table | 5: focus ring |
| 6: electrostatic chuck | 6a: electrode |
| 6b: insulator | 10a: first high-frequency power source |
| 10b: second high-frequency power source | |
| 15: processing gas supply source | |
| 16: shower head | 16a: body portion |
| 16b: upper top plate | 52: variable DC power supply |
| 60: controller | 61: process controller |
| 62: user interface | 63: storage unit |
| 71: exhaust port | 72: exhaust pipe |
| 73: exhaust device | |

What is claimed is:

1. A plasma processing method comprising:
a film forming step of forming a silicon oxide film on a surface of a member within a chamber by plasma of an oxygen-containing gas and a silicon-containing gas in which a flow rate ratio of the oxygen-containing gas to the silicon-containing gas ranges from 0.2 to 1.4;
a plasma processing step of performing a plasma processing on a workpiece carried into the chamber by plasma of a processing gas after the silicon oxide film is formed on the surface of the member;
a removal step of removing the silicon oxide film from the surface of the member by plasma of a fluorine-containing gas after the workpiece that has been subjected to the plasma processing is carried out of the chamber; and
a modification step of modifying the silicon oxide film by plasma of a reducing gas containing at least one of $H_2$, $CH_4$ and $C_3H_6$ after the film forming step.

2. The plasma processing method of claim 1, wherein in the film forming step, a flow rate of the silicon-containing gas is 150 sccm or more.

3. The plasma processing method of claim 1, wherein the silicon-containing gas contains at least one of $SiF_4$ and $SiCl_4$.

4. A plasma processing method comprising:
a film forming step of forming a silicon oxide film on a surface of a member within a chamber by plasma of an oxygen-containing gas and a silicon-containing gas in which a flow rate ratio of the oxygen-containing gas to the silicon-containing gas ranges from 0.2 to 1.4;
a plasma processing step of performing a plasma processing on a workpiece carried into the chamber by plasma of a processing gas after the silicon oxide film is formed on the surface of the member;
a removal step of removing the silicon oxide film from the surface of the member by plasma of a fluorine-containing gas after the workpiece that has been subjected to the plasma processing is carried out of the chamber,
wherein the method further comprises:
a film pre-forming step of forming a carbon-containing film on the surface of the member by plasma of a carbon-containing gas before the film forming step.

5. The plasma processing method of claim 4, wherein the carbon-containing gas contains a gas represented by $C_xH_yF_z$ (in a formula, x, y and z represent integers, and (z−y)/x is 2 or less).

6. The plasma processing method of claim 4, wherein the carbon-containing gas contains at least one of $CH_4$, $C_4F_8$, $CHF_3$, $CH_3F$, and $C_2H_4$.

7. The plasma processing method of claim 4, wherein the silicon oxide film from the surface of the member is removed from the surface of the member by the plasma of the fluorine-containing gas, and the carbon-containing film is removed from the surface of the member by plasma of an oxygen-containing gas.

8. A plasma processing method comprising:
a film forming step of forming a carbon-silicon-containing film on a surface of a member within a chamber by plasma of a carbon-containing gas, an oxygen-containing gas and a silicon-containing gas in which a flow rate ratio of the oxygen-containing gas to the silicon-containing gas ranges from 0.2 to 1.4;
a plasma processing step of performing a plasma processing on a workpiece carried into the chamber by plasma of a processing gas after the carbon-silicon-containing film is formed on the surface of the member;
a removal step of removing the carbon-silicon-containing film from the surface of the member by plasma of an oxygen-fluorine-containing gas after the workpiece that has been subjected to the plasma processing is carried out of the chamber; and
a modification step of modifying the carbon-silicon-containing film by plasma of a reducing gas containing at least one of $H_2$, $CH_4$ and $C_3H_6$ after the film forming step.

9. The plasma processing method of claim 8, wherein the carbon-containing gas contains a gas represented by $C_xH_yF_z$ (in a formula, x, y and z represent integers, and (z−y)/x is 2 or less).

10. The plasma processing method of claim 8, wherein the carbon-containing gas contains at least one of $CH_4$, $C_4F_8$, $CHF_3$, $CH_3F$, and $C_2H_4$.

11. The plasma processing method of claim 1, further comprising:
a film pre-forming step of forming a carbon-containing film on the surface of the member by plasma of a carbon-containing gas before the film forming step.

12. The plasma processing method of claim 11, wherein the removal step includes a first removal step of removing the silicon oxide film from the surface of the member by the plasma of the fluorine-containing gas, and a second removal step of removing the carbon-containing film from the surface of the member by plasma of an oxygen-containing gas.

13. The plasma processing method of claim 1, wherein the silicon-containing gas contains $SiCl_4$.

14. The plasma processing method of claim 1, wherein the film forming step does not include applying high frequency power for ion attraction.

15. The plasma processing method of claim 1, wherein the removal step does not include applying high frequency power for ion attraction.

16. The plasma processing method of claim 1, wherein the modification step does not include applying high frequency power for ion attraction.

\* \* \* \* \*